United States Patent
Wang et al.

(10) Patent No.: US 10,222,426 B2
(45) Date of Patent: Mar. 5, 2019

(54) DOUBLE-PULSE TECHNIQUE FOR ON-LINE DIAGNOSTICS OF ELECTROCHEMICAL SYSTEMS

(71) Applicant: HRL Laboratories, LLC, Malibu, CA (US)

(72) Inventors: Shuoqin Wang, Oak Park, CA (US); Luan D. Vu, Midway City, CA (US)

(73) Assignee: HRL Laboratories, LLC, Malibu, CA (US)

( * ) Notice: Subject to any disclaimer, the term of this patent is extended or adjusted under 35 U.S.C. 154(b) by 941 days.

(21) Appl. No.: 14/301,334

(22) Filed: Jun. 11, 2014

(65) Prior Publication Data

US 2014/0372054 A1    Dec. 18, 2014

Related U.S. Application Data

(60) Provisional application No. 61/834,906, filed on Jun. 14, 2013.

(51) Int. Cl.
*G01R 31/36* (2006.01)

(52) U.S. Cl.
CPC ..... *G01R 31/3624* (2013.01); *G01R 31/3651* (2013.01); *G01R 31/3662* (2013.01); *G01R 31/3679* (2013.01)

(58) Field of Classification Search
CPC ............ G01R 31/3624; G01R 31/3651; G01R 31/3662; G01R 31/3679; G01R 31/40; G06F 15/00
USPC ........................................................ 702/63
See application file for complete search history.

(56) References Cited

U.S. PATENT DOCUMENTS

| | | | |
|---|---|---|---|
| 5,280,424 A * | 1/1994 | Rony | B01J 19/0006 422/108 |
| 5,633,801 A | 5/1997 | Bottman | |
| 5,914,605 A * | 6/1999 | Bertness | G01R 31/36 320/161 |

(Continued)

OTHER PUBLICATIONS

Xiao et al., "A universal state-of-charge algorithm for batteries," 47th IEEE Design Automation Conference, Anaheim, CA, 2010.

(Continued)

*Primary Examiner* — Stephanie Bloss
(74) *Attorney, Agent, or Firm* — O'Connor & Company

(57) ABSTRACT

A method for dynamic characterization of an electrochemical system (such as a lithium-ion battery) is provided, comprising exciting an electrochemical system with a plurality of double-pulse sequences, each comprising a constant-current discharge pulse, a constant-current charge pulse having the same pulse width and pulse amplitude, and a zero-current period between the pulses; and calculating an impulse response, using a recursive or matrix-based method, to dynamically characterize the electrochemical system. A constant state-of-charge is maintained in the electrochemical system. Therefore the signal-to-noise ratio is high due to the repetition of the driving sequence. This method may be employed for on-line determination of the impedance spectrum of an electrochemical system, since the cycling profile can be easily integrated into charge/discharge profiles. Batteries (and other devices) can be diagnosed at high speed and with high accuracy. The double-pulse sequence is robust for fairly noisy systems.

18 Claims, 20 Drawing Sheets

(56) References Cited

U.S. PATENT DOCUMENTS

| | | | |
|---|---|---|---|
| 6,137,269 A | 10/2000 | Champlin | |
| 6,294,897 B1 | 9/2001 | Champlin | |
| 6,339,334 B1* | 1/2002 | Park | G01N 27/416 |
| | | | 324/425 |
| 7,015,701 B2 | 3/2006 | Wiegand | |
| 7,504,835 B2 | 3/2009 | Byington et al. | |
| 9,417,290 B1* | 8/2016 | Wang | G01R 31/40 |
| 2011/0060538 A1* | 3/2011 | Fahimi | G01R 31/3679 |
| | | | 702/63 |
| 2012/0099618 A1 | 4/2012 | Nishi et al. | |
| 2013/0193998 A1* | 8/2013 | Tang | G01R 31/14 |
| | | | 324/764.01 |

OTHER PUBLICATIONS

Wang et al., "Multi-parameter battery state estimator based on the adaptive and direct solution of the governing differential equations" Journal of Power Sources 196 (2011) 8735-8741.

Kiani, "Online Detection of Faulty Battery Cells in Energy Storage Systems Via Impulse Response Method" 978-1-61284-247-9/11 2011 IEEE.

Buller et al., Impedance-Based Simulation Models of Supercapacitors and Li-Ion Batteries for Power Electronic Applications, IEEE Transactions on Industry Applications, vol. 41, No. 3, May/Jun. 2005.

* cited by examiner

DOUBLE-PULSE TECHNIQUE FOR ON-LINE DIAGNOSTICS OF ELECTROCHEMICAL SYSTEMS

PRIORITY DATA

This non-provisional patent application claims priority to U.S. Provisional Patent Application No. 61/834,906, filed Jun. 14, 2013, which is hereby incorporated by reference herein in its entirety.

FIELD OF THE INVENTION

The present invention generally relates to the real-time characterization of electrochemical systems, such as batteries and fuel cells.

BACKGROUND OF THE INVENTION

An electrochemical system is a system that either derives electrical energy from chemical reactions, or facilitates chemical reactions through the introduction of electrical energy. An electrochemical system generally includes a cathode, an anode, and an electrolyte, and is typically complex with multiple heterogeneous subsystems, multiple scales from nanometers to meters. Examples of these systems include fuel cells, batteries, and electroplating systems. On-line characterization of batteries or fuel cells in vehicles is difficult, due to very rough noisy environments. The problems have emerged in recent years with the significant expanding market of battery-powered vehicles, and consequently the public concerns of battery safety and battery life calendars.

Although there may be many kinds of characterization models for an electrochemical system, equivalent circuit models are most appropriate in many applications where stringent real-time requirements and limiting computing powers need to be considered. An algorithm for a circuit model is relatively simple, meaning that simulation time is short and the computation cost is relatively low. A circuit model is an empirical model that describes the electrochemical system with a resistor-capacitor (or resistor-inductor-capacitor) circuit.

In a suitable circuit model, major effects of thermodynamic and kinetic processes in the electrochemical system can be represented by circuit elements. For example, the electrode potential between the cathode and the anode of a system can be represented with a voltage source, the charge-transfer processes can be represented with charge-transfer resistances, the double-layer adsorption can be represented with capacitances, and mass-transfer or diffusion effects can be represented with resistances such as Warburg resistances. Therefore a circuit model is extremely useful for many on-line diagnostics of the real-time states of an electrochemical system.

On-line and real-time characterization of such electrochemical systems is desirable in many applications, which include real-time evaluation of in-flight batteries on a satellite or aviation vehicle, and dynamic diagnostics of fraction batteries for electric and hybrid-electric vehicles. In many battery-powered systems, the efficiency of batteries can be greatly enhanced by intelligent management of the electrochemical energy storage system. Management is only possible with proper diagnosis of the battery states.

As the transportation industry strives to electrify vehicles with Li-ion batteries, on-line battery diagnostics becomes more essential due to critical issues such as battery safety, operation range, and calendar life. Among all the electrochemistry tools that can be used for battery diagnostics, electrochemical impedance spectroscopy (EIS) is an indispensable tool. This is because most battery failure modes such as electrolyte corrosion, hard and soft (dendritic) shorts, and thermal runaways can be traced by their signatures in the impendence spectroscopy. Reliable battery operation needs accurate estimation of the electrode voltages, which is correlated to the accurate estimation of the battery parameters. Background information regarding EIS can be found in Buller et al., "Impedance-based simulation models of supercapacitors and Li-ion batteries for power electronic applications," *IEEE Transactions on Industry Applications*, vol. 41, no. 3, pp. 742-747 (2005).

The present state of art of EIS, however, has limitations for on-line battery characterization. Since the typical design is mainly focused on accurate impedance measurements at the charge-transfer interface, the signals used for driving a battery and their mathematical methods are not applicable for on-line characterization. For example, the driving signals used in the prior art are generally small, so that the resultant polarization potentials of the electrodes are small in a linear region. However, in vehicle application, batteries are sometimes in charge depletion mode; the mathematical method employed in most EIS methods in the art is frequency-domain analysis. It provides high signal-noise-ratio but is not applicable for on-line characterization.

The dynamic performance of a battery is determined not only by the charge-transfer reaction at the interface, but also by the other factors, such as mass transfer (diffusion) effects in solid phases. The amplitudes of prior-art profiles are typically small in order to guarantee that the reactions are around equilibrium states of the system. In calculating the dynamic parameters, such as impedances, prior art typically works in the frequency domain and employs a non-iterative procedure.

New methods are needed to apply impedance analysis in time domain aiming for the application of on-line diagnostics. In view of the shortcomings in the art, improved methods for characterizing electrochemical systems are needed. These methods, and the apparatus and systems to implement them, preferably are able to broadly accept various exciting signals, are stable and robust against noises, and are agile for real-time use.

SUMMARY OF THE INVENTION

The present invention addresses the aforementioned needs in the art, as will now be summarized and then further described in detail below.

In some variations, the present invention provides a method for dynamic characterization of an electrochemical system, the method comprising:

(a) selecting an electrochemical system to be characterized at a plurality of times within a selected sampling window;

(b) exciting the system with a plurality of double-pulse sequences, wherein each of the double-pulse sequences comprises a discharge pulse having a pulse width and a pulse amplitude, a charge pulse having the pulse width and the pulse amplitude, and a zero-current period;

(c) receiving current data inputs each comprising measured current at a plurality of times associated with the double-pulse sequences;

(d) receiving voltage data inputs each comprising measured voltage at a plurality of times associated with the double-pulse sequences;

(e) calculating a plurality of current-derivative data inputs each comprising the time derivative of the measured current at the plurality of times;

(f) calculating a plurality of voltage-derivative data inputs each comprising the time derivative of the measured voltage at the plurality of times; and (g) calculating an impulse response from the current, voltage, current-derivative, and voltage-derivative data inputs, at the plurality of times using a recursive or matrix-based technique, wherein the impulse response dynamically characterizes the electrochemical system.

In some embodiments, the electrochemical system is selected from the group consisting of a battery, a fuel cell, an electrolytic cell, a capacitor, a supercapacitor, a pseudo-capacitor, an electroplating system, and a galvanic corrosion system. In certain embodiments, the electrochemical system is a lithium-ion battery.

In some embodiments, the discharge pulse is a constant-current discharge pulse and the charge pulse is a constant-current charge pulse. In other embodiments, the discharge pulse is a varying-current discharge pulse and/or the charge pulse is a varying-current charge pulse. Preferably, the charge pulse is symmetric with the discharge pulse.

The plurality of double-pulse sequences includes at least two double-pulse sequences, such as three, four, five, six, seven, eight, nine or more double-pulse sequences.

The pulse width may be tuned to characterize a main response time of the electrochemical system. The pulse amplitude may be tuned to characterize a diffusion response of the electrochemical system. For example, when the electrochemical system is a lithium-ion battery, the pulse amplitude may be tuned to characterize a diffusion response of the lithium-ion battery in at least one electrode solid phase.

In some embodiments, each of the double-pulse sequences comprises a first zero-current period between the discharge pulse and the charge pulse, and a second zero-current period after the charge pulse.

Step (e) may include approximating the time derivative of the measured current using a difference of the current data inputs (such as at two different times). Step (f) may include approximating the time derivative of the measured voltage using a difference of the voltage data inputs (such as at two different times). Step (g) may utilize a Kalman filtering technique, such as a recursive or matrix-based Kalman filtering technique.

In some embodiments, a finite impulse response digital filter is utilized to derive the impulse response at the plurality of times. In these or other embodiments, an infinite impulse response digital filter is utilized to derive the impulse response at the plurality of times.

The method further may include the step of calculating the Fourier transform of the impulse response to obtain at least one electrochemical system state. The electrochemical system state may be selected from the group consisting of state-of-health, state-of-charge, state-of-power, high-frequency resistance, charge-transfer resistance, and double-layer capacitance.

Some variations of the invention provide an apparatus for dynamic characterization of an electrochemical system, the apparatus comprising a computer that is electrically linkable to the electrochemical system; the computer programmed using non-transitory memory with executable code for executing the steps of:

(a) exciting said electrochemical system with a plurality of double-pulse sequences, wherein each of said double-pulse sequences comprises a discharge pulse having a pulse width and a pulse amplitude, a charge pulse having said pulse width and said pulse amplitude, and a zero-current period;

(b) sensing, in said computer, current data inputs each comprising measured current at a plurality of times associated with said double-pulse sequences;

(c) sensing, in said computer, voltage data inputs each comprising measured voltage at a plurality of times associated with said double-pulse sequences;

(d) calculating, in said computer, a plurality of current-derivative data inputs each comprising the time derivative of said measured current at said plurality of times;

(e) calculating, in said computer, a plurality of voltage-derivative data inputs each comprising the time derivative of said measured voltage at said plurality of times; and (f) calculating an impulse response from said current, voltage, current-derivative, and voltage-derivative data inputs, at said plurality of times using a recursive or matrix-based method performed in said computer, wherein said impulse response characterizes the dynamics of said electrochemical system.

In some embodiments, the computer is programmed to filter out static noises associated with the current and voltage data inputs. In some embodiments, the computer is programmed to adjust the pulse width, to characterize a main response time of the electrochemical system. In these or other embodiments, the computer is programmed to adjust the pulse amplitude, to characterize a diffusion response of the electrochemical system.

The computer may be programmed to solve a least-squares matrix-based equation to calculate the impulse response. Alternatively, or additionally, the computer may be programmed to solve a recursive least-squares equation to calculate the impulse response. The computer may be programmed to utilize a recursive or matrix-based Kalman filtering technique to execute step (e). The computer may be programmed with a finite impulse response digital filter and/or infinite impulse response digital filter, to derive the impulse response at the plurality of times. The computer may further be programmed to calculate the Fourier transform of the impulse response to obtain at least one electrochemical system stat, such as an electrochemical system state selected from the group consisting of state-of-charge, state-of-power, state-of-health, high-frequency resistance, charge-transfer resistance, and double-layer capacitance.

Other variations provide a system for dynamically characterizing an electrochemical device, the system comprising an electrochemical device and a programmable power-supply apparatus electrically linked with the electrochemical device, wherein the programmable power-supply apparatus is programmed using non-transitory memory with executable code for executing the steps of:

(a) exciting the electrochemical system with a plurality of double-pulse sequences, wherein each of the double-pulse sequences comprises a discharge pulse having a pulse width and a pulse amplitude, a charge pulse having the pulse width and the pulse amplitude, and a zero-current period;

(b) sensing, in the computer, current data inputs each comprising measured current at a plurality of times associated with the double-pulse sequences;

(c) sensing, in the computer, voltage data inputs each comprising measured voltage at a plurality of times associated with the double-pulse sequences;

(d) calculating, in the computer, a plurality of current-derivative data inputs each comprising the time derivative of the measured current at the plurality of times;

(e) calculating, in the computer, a plurality of voltage-derivative data inputs each comprising the time derivative of the measured voltage at the plurality of times; and (f) calculating an impulse response from the current, voltage, current-derivative, and voltage-derivative data inputs, at the plurality of times using a recursive or matrix-based method performed in the computer, wherein the impulse response characterizes the dynamics of the electrochemical system.

The electrochemical device may be selected from the group consisting of a battery, a fuel cell, an electrolytic cell, a capacitor, a supercapacitor, a pseudocapacitor, an electroplating system, and a galvanic corrosion system.

In some embodiments, the programmable power-supply apparatus is programmed to filter out static noises associated with the current and voltage data inputs.

In some embodiments, the programmable power-supply apparatus is programmed to adjust the pulse width, to characterize a main response time of the electrochemical system. The programmable power-supply apparatus may also be programmed to adjust the pulse amplitude, to characterize a diffusion response of the electrochemical system.

The programmable power-supply apparatus may be programmed to solve a least-squares recursive or matrix-based equation to calculate the impulse response. The programmable power-supply apparatus may be programmed to utilize a recursive or matrix-based Kalman filtering technique to execute step (e).

The programmable power-supply apparatus may be programmed with a finite impulse response digital filter to derive the impulse response at the plurality of times. Alternatively or additionally, the programmable power-supply apparatus may be programmed with an infinite impulse response digital filter to derive the impulse response at the plurality of times.

The programmable power-supply apparatus is further programmed, in some embodiments, to calculate the Fourier transform of the impulse response to obtain at least one electrochemical system state. The electrochemical system state may be selected from the group consisting of state-of-charge, state-of-power, state-of-health, high-frequency resistance, charge-transfer resistance, and double-layer capacitance.

Still other variations of this invention provide a computer-readable medium containing program instructions for characterizing the dynamics of an electrochemical system, wherein execution of the program instructions by one or more processors of a computer causes the one or more processors to carry out the steps of:

(a) exciting the electrochemical system with a plurality of double-pulse sequences, wherein each of the double-pulse sequences comprises a discharge pulse having a pulse width and a pulse amplitude, a charge pulse having the pulse width and the pulse amplitude, and a zero-current period;

(b) sensing, in the computer, current data inputs each comprising measured current at a plurality of times associated with the double-pulse sequences;

(c) sensing, in the computer, voltage data inputs each comprising measured voltage at a plurality of times associated with the double-pulse sequences;

(d) calculating, in the computer, a plurality of current-derivative data inputs each comprising the time derivative of the measured current at the plurality of times;

(e) calculating, in the computer, a plurality of voltage-derivative data inputs each comprising the time derivative of the measured voltage at the plurality of times; and (f) calculating an impulse response from the current, voltage, current-derivative, and voltage-derivative data inputs, at the plurality of times using a recursive or matrix-based method performed in the computer, wherein the impulse response characterizes the dynamics of the electrochemical system.

In some embodiments, the program instructions include instructions to adjust the pulse width, to characterize a main response time of the electrochemical system. In some embodiments, the program instructions include instructions to adjust the pulse amplitude, to characterize a diffusion response of the electrochemical system.

In some embodiments, the program instructions include a Kalman filtering technique to execute step (f). In some embodiments, the program instructions include a finite impulse response digital filter or an infinite impulse response digital filter to derive the impulse response at the plurality of times. Also the program instructions may include instructions to estimate at least one electrochemical system state selected from the group consisting of state-of-charge, state-of-power, state-of-health, high-frequency resistance, charge-transfer resistance, and double-layer capacitance. The program instructions calculate the Fourier transform of the impulse response, in some embodiments, to obtain at least one of the electrochemical system states.

BRIEF DESCRIPTION OF THE DRAWINGS

FIG. 6 is a series of experimental plots demonstrating improvement of the signal-to-noise ratio of H(t) as the number of pulses is increased.

FIG. 7 is a series of experimental plots revealing battery kinetics at different temperatures. The temperatures tested are 10° C.

DETAILED DESCRIPTION OF EMBODIMENTS OF THE INVENTION

Figure 1:
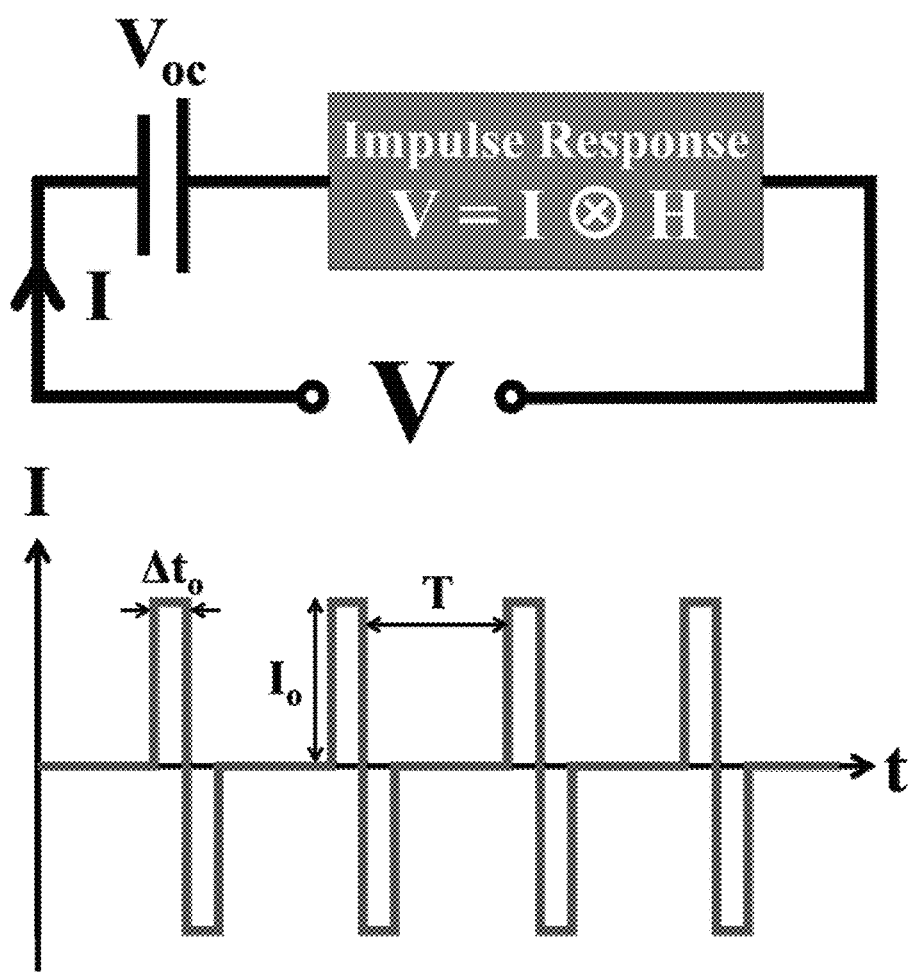
FIG. 1 is a schematic of the impulse-response model and an illustration of an exemplary double-pulse current-input signal, in some variations of the invention.

The methods, apparatus, and systems of the present invention will be described in detail by reference to various non-limiting embodiments and figures.

This description will enable one skilled in the art to make and use the invention, and it describes several embodiments, adaptations, variations, alternatives, and uses of the invention. These and other embodiments, features, and advantages of the present invention will become more apparent to those skilled in the art when taken with reference to the following detailed description of the invention in conjunction with the accompanying drawings.

As used in this specification and the appended claims, the singular forms "a," "an," and "the" include plural referents unless the context clearly indicates otherwise. Unless defined otherwise, all technical and scientific terms used herein have the same meaning as is commonly understood by one of ordinary skill in the art to which this invention belongs. As intended herein, "receiving" shall be broadly construed as including "providing," "obtaining," "sensing" (e.g., using a sensor attached to a computer), "calculating" (e.g., using executable code in a computer), and so on.

Unless otherwise indicated, all numbers expressing parameters, conditions, results, and so forth used in the specification and claims are to be understood as being modified in all instances by the term "about." Accordingly, unless indicated to the contrary, the numbers set forth in the following specification and attached claims are approximations that may vary depending upon specific methods and calculations.

The term "comprising," which is synonymous with "including," "containing," or "characterized by" is inclusive or open-ended and does not exclude additional, unrecited elements or method steps. "Comprising" is a term of art used in claim language which means that the named claim elements are essential, but other claim elements may be added and still form a construct within the scope of the claim.

As used herein, the phase "consisting of" excludes any element, step, or ingredient not specified in the claim. When the phrase "consists of" (or variations thereof) appears in a clause of the body of a claim, rather than immediately following the preamble, it limits only the element set forth in that clause; other elements are not excluded from the claim as a whole. As used herein, the phase "consisting essentially of" limits the scope of a claim to the specified elements or method steps, plus those that do not materially affect the basis and novel characteristic(s) of the claimed subject matter.

With respect to the terms "comprising," "consisting of," and "consisting essentially of," where one of these three terms is used herein, the presently disclosed and claimed subject matter may include the use of either of the other two terms. Thus in some embodiments not otherwise explicitly recited, any instance of "comprising" may be replaced by "consisting of" or, alternatively, by "consisting essentially of".

Some variations of this invention utilize an impulse-response-based method for on-line characterization of an electrochemical system. A method as provided herein may utilize measured current (I) and/or voltage (V) signals to directly extract thermodynamic and kinetic information associated with the electrochemical system, dynamically (in real time). The impulse-response-based methods of the present invention can provide high-speed characterization of an electrochemical system with improved accuracy. The methods are robust and suitable for real environment applications under various operating conditions.

The methods work in the time domain without relying on frequency-domain transformations. Therefore, these methods are more aligned for real-time applications. By avoiding frequency-domain transformations, the methods provided herein, in some embodiments, can surprisingly regress the results 1-2 orders of magnitudes faster compared to prior methods.

In addition, the disclosed impulse-response-based methods provide broader capabilities in characterizing an electrochemical system by prescribing an impulse-response function. Circuit models employing conventional circuit elements can have difficulty describing some kinetic processes. In particular, the methods herein explicitly account for time-domain diffusion phenomena.

Some variations of the present invention are premised on the utilization of a double-pulse battery driving profile for on-line diagnostics of an electrochemical system (e.g., a battery). A preferred driving profile includes a three-part sequence containing a constant-current discharge pulse, a constant-current charge pulse, and a zero-current period. This sequence may be repeated multiple times to produce the driving profile.

In the case of a lithium-ion battery, for example, the double-pulse driving profile may be tuned to diagnose characteristics of the battery. The pulse width may be tuned so as to characterize the main response time of the battery, and the pulse amplitude may be tuned to excite the diffusion response of the Li-ion in the solid phase of the electrodes. With an impulse-response model as described herein, the kinetic response of the battery can be deduced, covering the entire bandwidth of the impedance characterization spectrum of the battery (or other electrochemical system).

A constant state-of-charge may be maintained in the electrochemical system, which means that despite repetitive testing, minimal or no thermodynamic changes occur during the driving test. Therefore the signal-to-noise (SNR) ratio can be very high due to the repetition of the driving sequence.

Also, this method may be employed for on-line determination of the impedance spectrum of an electrochemical system, since the cycling profile can be easily integrated into charge/discharge profiles.

In preferred embodiments, batteries (and other devices) can be diagnosed at high speed and with high accuracy. Because a random driving profile cannot guarantee that the frequency responses cover the entire bandwidth of the impedance spectrum of the electrochemical system, preferred embodiments employ double-pulse driving profiles designed (as described herein) to broaden the frequency responses and emphasize important frequencies. Since double-pulse sequences maintain the state-of-charge of the electrochemical system, the double-pulse sequence can be used as many times as necessary, for the desired accuracy or for other reasons. Additionally, with the use of multiple sequences of the double pulse, the noise associated with the electrochemical system is greatly reduced, thereby increasing the signal-to-noise ratio. The double-pulse sequence is thus robust for fairly noisy systems.

When an electrochemical impedance spectrometer is used to obtain the impedance spectrum, according to the prior art, each desired frequency is tested individually. For the double-pulse method provided in this disclosure, only one pulse sequence is needed to obtain the impedance spectrum. Another benefit is that the double-pulse method may be used for an on-line system. This means that the impedance spectrum of an electrochemical system can be obtained even during battery use, which provides real-time battery parameters which may be useful for battery safety and warranty of calendar life.

Generally speaking, any system having an anode and a cathode; any system that supplies, receives, or is in electrical communication with a current and a voltage source or signal; or any system capable of being characterized utilizing the principles described herein, may be an "electrochemical system" within the intended meaning. Electrochemical systems that may be characterized using these impulse-response-based methods include, but are by no means limited to, batteries, electrolytic cells, fuel cells, capacitors, supercapacitors, ultracapacitors, hybrid combustion-electric systems, and other energy-delivery or energy-storage devices.

Electrochemical systems include not only systems intended to provide energy or store energy, but also systems that utilize electrochemical reactions to carry out chemistry or separations of matter. Such electrochemistry applications include electroplating and galvanic corrosion for carrying out chemical reactions, and electrochemical separators for separations of matter. Electrochemical separators include electrochemical membranes and electrostatic precipitators, for example.

When the electrochemical system is a battery, the impulse-response-based method enables one to accurately estimate the battery states under dynamic operating conditions. Battery states include, but are not limited to, state-of-health, state-of-charge, state-of-power, high-frequency resistance, charge-transfer resistance, and double-layer capacitance. State-of-health is a figure of merit of the condition of a battery (or a cell, or a battery pack), compared to its ideal conditions. State-of-charge (SOC) is an indication of how much useful energy remains in the battery. State-of-power characterizes the charge and discharge power capabilities of the battery. High-frequency resistance, charge-transfer resistance, and double-layer capacitance characterize the actual kinetic processes that take place in the battery, including both electrochemical reactions as well as mass transport and diffusion processes.

Some variations of the invention provide methods for dynamic characterization of an electrochemical system, the method comprising:

(a) selecting an electrochemical system to be characterized at a plurality of times within a selected sampling window;

(b) exciting the system with a plurality of double-pulse sequences, wherein each of the double-pulse sequences comprises a discharge pulse having a pulse width and a pulse amplitude, a charge pulse having the pulse width and the pulse amplitude, and a zero-current period;

(c) receiving current data inputs each comprising measured current at a plurality of times associated with the double-pulse sequences;

(d) receiving voltage data inputs each comprising measured voltage at a plurality of times associated with the double-pulse sequences;

(e) calculating a plurality of current-derivative data inputs each comprising the time derivative of the measured current at the plurality of times;

(f) calculating a plurality of voltage-derivative data inputs each comprising the time derivative of the measured voltage at the plurality of times; and (g) calculating an impulse response from the current, voltage, current-derivative, and voltage-derivative data inputs, at the plurality of times using a recursive or matrix-based technique, wherein the impulse response dynamically characterizes the electrochemical system.

In some embodiments, the electrochemical system is selected from the group consisting of a battery, a fuel cell, an electrolytic cell, a capacitor, a supercapacitor, a pseudo-capacitor, an electroplating system, and a galvanic corrosion system. In certain embodiments, the electrochemical system is a lithium-ion battery.

In some embodiments, the discharge pulse is a constant-current discharge pulse and the charge pulse is a constant-current charge pulse. There will generally be a zero-current period between the discharge and charge pulses. That period may be constant or varying. In some embodiments, each of the double-pulse sequences comprises a first zero-current period between the discharge pulse and the charge pulse, and a second zero-current period after the charge pulse and before the next discharge pulse. The first zero-current period and second zero-current period may be the same or different, and again, each of them may be constant or varying.

The magnitude of the constant-current discharge pulse is preferably the same as the magnitude of the constant-current charge pulse, so that integration of current over time is zero. When the integration of current over time is zero, the capacity of the battery is intact during the diagnosis. The double pulse is preferably symmetric (i.e. charge and discharge pulses being symmetric to each other, with opposite signs of the magnitude) so that the battery SOC is maintained while additional double pulses can be applied to the system. Additionally, since the kinetics are SOC-dependent, a symmetric double pulse enables more-accurate characterization at constant SOC.

It should be recognized however that the discharge pulse and charge pulse might not be strictly identical in magnitude, without departing from the spirit of the invention. In certain embodiments, the magnitude of the constant-current discharge pulse is not the same as the magnitude of the constant-current charge pulse.

In other embodiments, the discharge pulse is a varying-current discharge pulse and the charge pulse is a varying-current charge pulse. In some embodiments, the discharge pulse is a constant-current discharge pulse while the charge pulse is a varying-current charge pulse; and in other embodiments, the discharge pulse is a varying-current discharge pulse while the charge pulse is a constant-current charge pulse. In any of these embodiments, it is preferred that the average magnitude of the constant-current discharge pulse is the same as the average magnitude of the constant-current charge pulse, so that integration of current over time remains zero over some period of time.

The plurality of double-pulse sequences includes at least 2 double-pulse sequences, such as 3, 4, 5, 6, 7, 8, 9, 10, 11, 12, 13, 14, 15, 16, 17, 18, 19, 20 or more double-pulse sequences. In certain embodiments of the invention, one double-pulse sequence is employed. Typically, at least two double-pulse sequences will be employed for better accuracy.

The pulse width may be tuned to characterize a main response time of the electrochemical system. The pulse amplitude may be tuned to characterize a diffusion response of the electrochemical system. For example, when the electrochemical system is a lithium-ion battery, the pulse amplitude may be tuned to characterize a diffusion response of lithium ions in at least one electrode solid phase (i.e., either the anode or cathode, or another electrode layer or solid phase if present). A sufficiently large magnitude of the pulse is needed only to excite the diffusion response of the $Li^+$ ion.

Figure 5A:
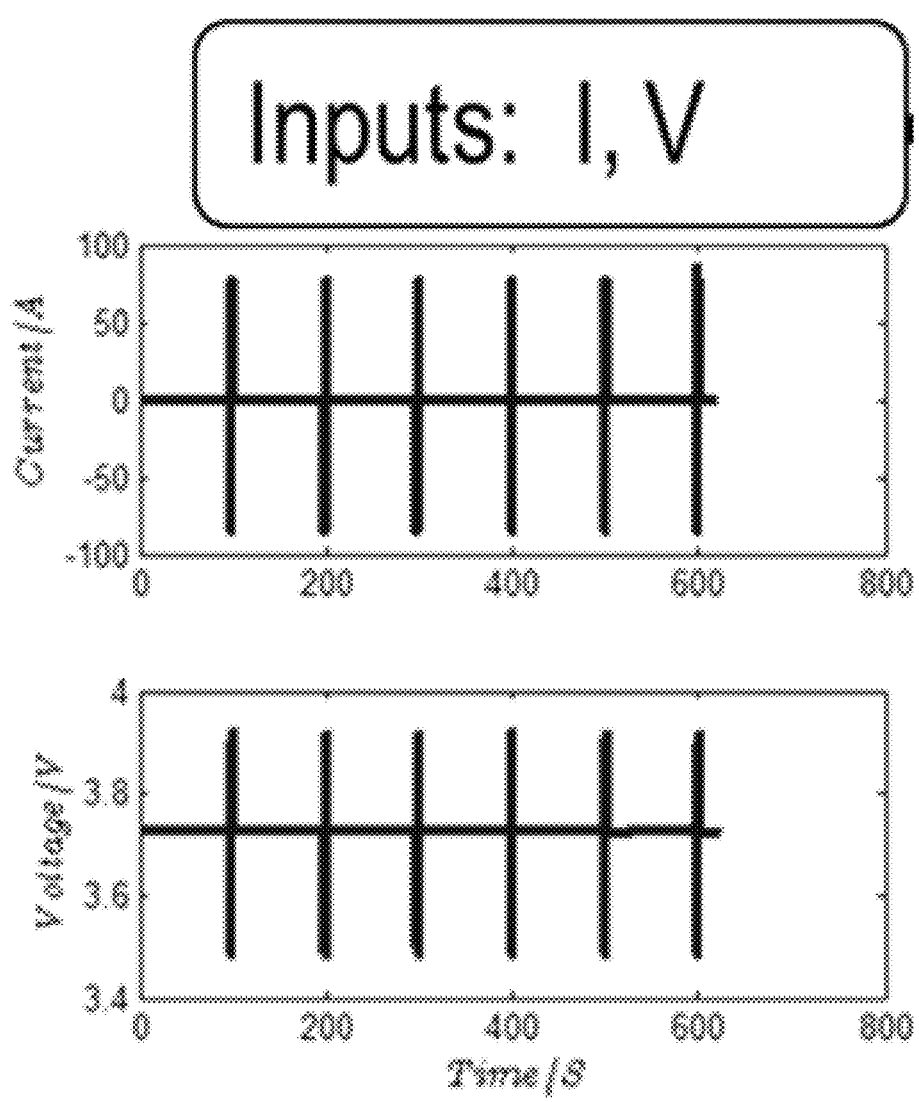
FIG. 5 is a series of experimental plots demonstrating real-time acquisition of the impulse response based on current and voltage data, measured when driving the battery with a series of charge-discharge pulses at room temperature. The I(t) and V(t) data, shown in FIG. 5A, are used to solve H(t) of the FIR implementation via a Kalman filter. The regressed H(t) function, shown in FIG. 5B, is then Fast-Fourier-transformed to obtain H(z).
FIG. 5C shows the magnitude (top graph) and phase (bottom graph) plots for H(z).
FIG. 5D shows the Nyquist plot for H(z), which demonstrates the impedance spectra of the battery kinetics.
Figure 5B:
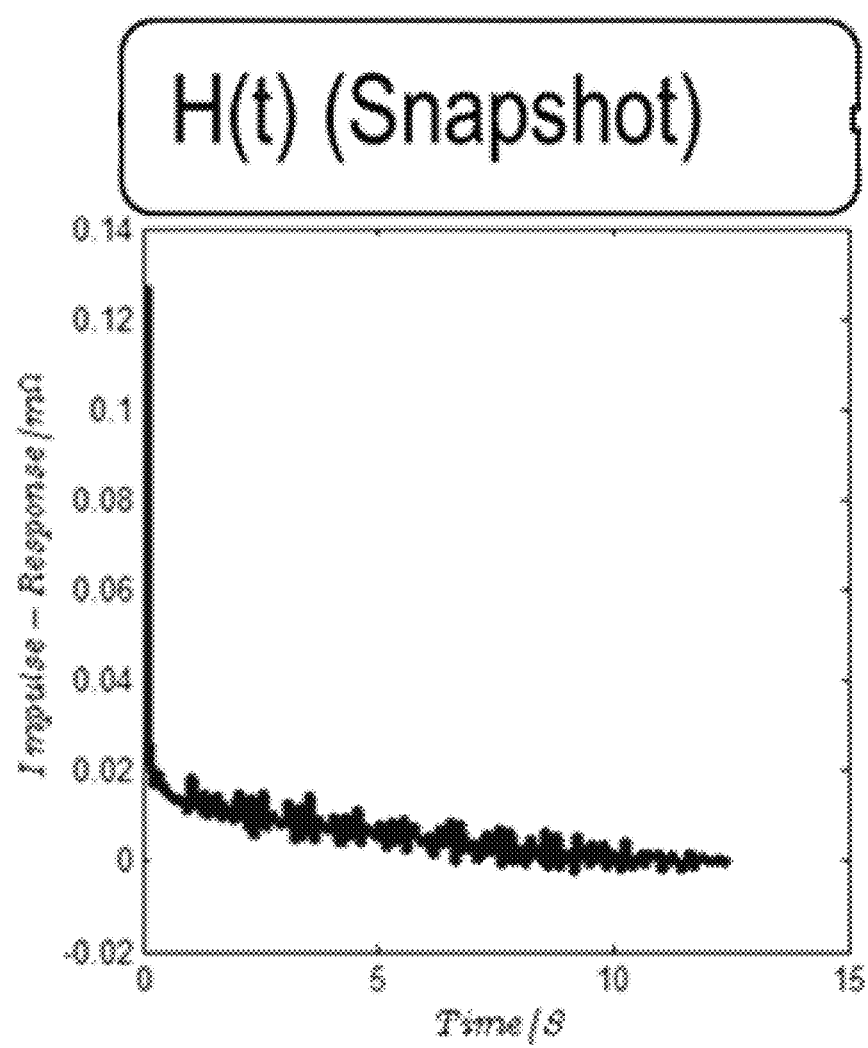

Note that the current data inputs of step (c) and voltage data inputs of step (d) are typically, although not necessarily, the same as the inputs requested into the system. In some embodiments, the current and voltage data inputs are as measured (as shown in FIG. 5A, for example). In other embodiments, the current and voltage data inputs that are received are those that are requested into the system (such as via programmable power-supply apparatus). Generally there is not a difference between requested and measured inputs, but there they can differ in principle (e.g., control logic issues or electrical dissipation).

Step (e) may include approximating the time derivative of the measured current using a difference of the current data inputs at two different times. Step (f) may include approximating the time derivative of the measured voltage using a difference of the voltage data inputs at two different times. Step (g) may utilize a recursive or matrix-based Kalman filtering technique, as explained further below.

In some embodiments, a finite impulse response digital filter is utilized to derive the impulse response at the plurality of times. In these or other embodiments, an infinite impulse response digital filter is utilized to derive the impulse response at the plurality of times. If desired, both of these digital filters may be utilized and the results compared or averaged.

The method further may include the step of calculating the Fourier transform of the impulse response to obtain at least one electrochemical system state. The electrochemical system state may be selected from the group consisting of state-of-health, state-of-charge, state-of-power, high-frequency resistance, charge-transfer resistance, and double-layer capacitance.

In order for the model to be robust against noises and be agile enough for real-time use, a method is employed that calculates or estimates an impulse response. In the method, the impulse response of the system is deduced with the current and voltage samples of a battery in a selected time window. A moving-window technique may be employed to update the method recursively. The sizes of the impulse response and the window can be adjusted to accommodate the bandwidth of the kinetic process of the system. Once the impulse repulse is deduced at real time, states of the electrochemical system can be derived based on the impulse repulse.

In some embodiments, the method implements noise-filtering techniques which enable stable regression in the presence of noise (e.g., due to electro-magnetic interference). Such noise reduction methods also improve the accuracy and reliability of the regressed parameters. Various types of noise in the current and/or voltage data may be present, including high-frequency noise.

In some embodiments, a high-frequency pass filter is used for filtering out static noises associated with current and voltage measurements. A high-frequency pass filter is an electronic filter that passes high-frequency signals but attenuates signals with frequencies lower than the cutoff frequency. High-frequency pass filtering to remove at least some static noises may be helpful in improving the stability of the method.

In some embodiments, a least-squares regression method is implemented for improving the stability of the method against high-frequency noises. Least-squares regression utilizes methods such as, but not limited to, linear least squares, non-linear least squares, partial least squares, sparse partial least squares, weighted least squares, least squares with penalty function, and combinations thereof.

The linear least-squares fitting technique is a convenient form of linear regression. For non-linear least squares fitting to a number of unknown parameters, linear least squares fitting may be applied iteratively to a linearized form of the function until convergence is achieved. It is also possible to linearize a non-linear function at the outset and still use linear methods for determining fit parameters. If uncertainties are known or estimated, points can be weighted differently in order to give the high-quality points more weight, if desired.

Electrochemical impedance spectroscopy (EIS) is a technique to study battery cell or electrode impedance against frequency. The complex impedance $Z(f)$, by definition, is expressed as $Z \equiv V(f)/I(f)$ where $I(f)$ is the battery current signal in the frequency domain, and $V(f)$ is the electrode voltage at the same frequency range as the current. By perturbing the cell with an alternating current signal of small magnitude and observing the voltage output, the battery impedance can be derived and related to battery kinetics and diffusion.

The EIS technique based on frequency-domain analysis, however, is not practical for on-line battery diagnostics. This is because, first of all, the view of impedance is obscured when a battery is not at its equilibrium. A battery is in equilibrium only when its electrode voltage equals the difference of electrochemical potentials of each individual electrode. Secondly, the only available I, V signals are in the time domain.

A new method for dynamic characterization of electrochemical systems is described in U.S. patent application Ser. No. 13/646,663, filed Oct. 6, 2012, for "METHODS AND APPARATUS FOR DYNAMIC CHARACTERIZATION OF ELECTROCHEMICAL SYSTEMS" (Wang et al.), which is hereby incorporated by reference herein. The methods described therein may be modified for on-line battery diagnostics, to employ a double-pulse technique provided in the present invention.

A schematic of a circuit model for a general electrochemical system is shown in the upper portion of FIG. 1. The total voltage response of a circuit can be formulated as the superposition of the zero-state response (ZSR) and the zero-input response (ZIR). The ZSR results only from the external inputs of driving currents of the circuit; the ZIR results only from the initial state of the circuit and not from any external drive. For an electrochemical system such as a battery, the ZIR is the open-circuit voltage (OCV or $V_{oc}$) source if the battery has been open circuit for a sufficient time, ignoring self-discharge, to reach an equilibrium state. The ZSR can be calculated as the convolution of the driving currents with an impulse response characterizing the system.

The equation of a voltage response of an electrochemical system such as a battery can be written as:

$$V(t) = OCV(t) + \int_0^\infty I(t-\tau)H(\tau)d\tau \quad \text{(EQ. 1)}$$

In EQ. 1, $V(t)$ and $I(t)$ are the measured voltage and current values as a function of time. $H(t)$ is the impulse response. In defining the integration range from 0 to $\infty$, we have complied with the causality that the real-time response is only caused by the inputs at the current time and the time before.

It is assumed that the impulse response converges to zero after finite time $T_o$, i.e., H(t)=0, as t>$T_o$. It is a reasonable approximation for many electrochemical systems, and EQ. 1 is modified as:

$$V(t)=OCV(t)+\int_0^{T_o} I(t-\tau)H(\tau)d\tau \qquad (EQ.\ 2)$$

Further modification is made by differentiating the two sides of the EQ. 2 with time. Differentiating data is equivalent to high-pass filtering for removing static noises which can improve the stability of the method. Moreover, we assume $$\frac{dV(t)}{dt} \gg \frac{dOCV(t)}{dt},$$

which is reasonable as long as there are finite current inputs. The result is EQ. 3:

$$\frac{dV(t)}{dt} = \int_0^{T_o} \frac{dI(t-\tau)}{dt} H(\tau)d\tau \qquad (EQ.\ 3)$$

EQ. 3 is the main equation relied upon to solve the impulse response H(t), in some embodiments. However, EQ. 3 is not an explicit formula for H(t).

The desired impulse response H(t) needs to be obtained by deconvolution from EQ. 3. EQ. 3 can be digitized, since evaluation is carried out at the sampling instants with T as the sampling interval. The digitized formula becomes EQ. 4:

$$[DV] = [DI] \cdot [H] \qquad (EQ.\ 4)$$

with $$[DV] = [V_{N+1} - V_N, V_{N+2} - V_{N+1}, \ldots, V_{N+M} - V_{N+M-1}]^T$$

$$[DI] = \begin{bmatrix} I_{N+1} - I_N & I_N - I_{N-1} & \ldots & I_2 - I_1 \\ I_{N+2} - I_{N+1} & I_{N+1} - I_N & \ldots & I_3 - I_2 \\ \ldots & \ldots & \ldots & \ldots \\ I_{N+M} - I_{N+M-1} & I_{N+M-1} - I_{N+M-2} & \ldots & I_{M+1} - I_M \end{bmatrix}$$

$$[H] = [H_0, H_1, \ldots, H_{N-1}]^T.$$

The subscripts in the EQ. 4 represent the sampling coefficients. In some embodiments, N can be chosen so that N≈$T_0$/T. H(t) is evaluated at t=0, T, 2T, . . . , (N−1)T and it is assumed that H(t)=0 for t≥$T_0$=NT. The sum of N and M defines the size of the temporal window, Δt=(N+M)T, in which the sampled V(t) and I(t) will be used to fill in the matrices of [DV] and [DI]. In these embodiments the sizes of the matrices [DV], [DI], and [H] are M×1, M×N, and N×1, respectively, which means that M≥N is the necessary condition for the valid solution of H(t).

With respect to EQS. 3 and 4, there is always noise in the V(t) and I(t) data which is not explicitly expressed. In order to improve the stability of the method against such noise, a least-squares method may be utilized to solve [H]. In the form of matrices, the solution is given by EQ. 5:

$$[H]=([DI]^T[DI])^{-1}[DI]^T[DV] \qquad (EQ.\ 5)$$

A valid solution to EQ. 5 for [H] can be acquired as long as the matrix product [G]=[DI]$^T$[DT] is nonsingular. The rank of [G] provides an estimate of the number of linearly independent rows or columns of [G], at given points in time. There are a number of ways to compute the rank. In some embodiments, singular value decomposition is employed.

In some embodiments, recursive methods are utilized wherein all information utilized stems from previous time-step calculations and measurements at the present time-steps. Optionally, a moving-window technique may be employed to update the method recursively. The sizes of the impulse response and the window can be adjusted to accommodate the bandwidth of the kinetics of the selected electrochemical system (e.g., a battery or fuel cell).

There are several methods to dictate the adjustment of the size of the sampling window. One method is to adjust the size based on the knowledge of the thermodynamics and kinetics of the electrochemical system. If the system has a more sluggish kinetic response, the window may be increased, and vice versa. The response time is different for different electrochemical systems. Also the response time is generally different for a given system at different times.

Another method dictate the adjustment of the size of the sampling window is based on mathematics. The size of the window can be increased at first, and the result of the impulse response H(t) can be used to compare with the H(t) with the original window size. If H(t) changes significantly, the sampling window size may be increased. If H(t) does not change significantly, the size of the window is deemed to be wide enough.

Due to the limitations of computer storage and constraints of embedded controllers, recursive methods may be preferred, in some embodiments. Using recursive methods, all information that is utilized at a given time-step derives from previous time-step calculations along with measurements at the present time-step. The following equations apply to recursive methods.

From EQ. 5, the recursive form can be derived as EQ. 6:

$$\sum_{i=0}^{N-1} H_i \sum_{j=0}^{M-1} DI_{ji} DI_{ji} = \sum_{j=0}^{M-1} DI_{ji} DV_j \qquad (EQ.\ 6)$$

where $$DI_{ij} = I_{N+i-j+1} - I_{N+i-j},$$

$$DV_i = V_{N+i+1} - V_{N+i}.$$

Each element of the impulse response [H] can be expressed as $$H_l = \frac{X_l - \sum_{i=0, i \neq l}^{N} H_i Y_{il}}{Z_l} = \frac{\sum_{j=0}^{M-1} DI_{jl} DV_j - \sum_{i=0, i \neq l}^{N} H_i \sum_{j=0}^{M-1} DI_{jl} DI_{ji}}{\sum_{j=0}^{M-1} DI_{jl}^2} \qquad (EQ.\ 7)$$

The $X_i$, $Y_{ij}$, $Z_i$ with i,j=0, 1, . . . , N are updated with the following recursive equations:

For i=1, 2, 3, . . . , N−1, $$X_i^t = X_{i-1}^{t-1}$$

$$Y_{iL}^t = Y_{i-1,L-1}^{t-1}$$

$$Y_{Li}^t = Y_{iL}^1, L=1, 2, \ldots N$$

$$Z_i^t = Z_{i-1}^{t-1}$$

For i=0, $$X_0^t = X_0^{t-1} + (I_{N+M+1} - I_{N+M})(V_{N+M+1} - V_{N+M}) - (I_{N+1} - I_N)(V_{N+1} - V_N)$$

$$Y_{0L}^t = Y_{0L}^{t-1} + (I_{N+M+1} - I_{N+M})(I_{N+M-L} - V_{N+M-L-1}) - (I_{N+1} - I_N)(V_{N-L+1} - V_{N-L}),$$

$$Y_{L0}^t = Y_{0L}^t$$

$$L = 1, 2, \ldots N$$

$$Z_0^t = Z_0^{t-1} + (I_{N+M+1} - I_{N+M})^2 - (I_{N+1} - I_N)^2$$

In calculating each $H_i$ (i=0, 1, N−1) at the current time with EQ. 7, the most-updated H elements are used on the right-hand side of the equation.

The Fourier transform of the impulse response H(t) represents the impedance spectroscopy. "Impedance spectroscopy" generally refers to signal measurement of the linear electrical response and subsequent analysis of the response to yield useful information about the physicochemical properties of a system (see Examples herein). From the impedance spectroscopy, state-of-health, state-of-charge, and state-of-power may be monitored.

Specifically, the impedance at high frequency may be used as an indicator for state-of-health. The reason is that the impedance of typical batteries increases with age. This high-frequency impedance can be directly read out from the spectrum, and directly correlated with state-of-health. State-of-charge may be deduced with the open circuit voltage via a voltage—state-of-charge look-up table. The open circuit voltage is a thermodynamic parameter which can be derived if the kinetic response of the system is known. State-of-power is the current response to the maximum/minimum voltage input. Therefore, it can be calculated with the convolution of the voltage and the impulse response.

The Fourier transform of a finite impulse response provides a frequency response to the system. Since a square wave can be represented by an infinite sum of sine waves, a double pulse can access the kinetics at all frequencies for analysis, in some embodiments.

In certain embodiments, additional data inputs (beyond current and voltage) are considered in the model and methods. Additional data inputs may relate to ambient conditions of the local environment, including temperature, pressure, relative humidity, and electromagnetic interference patterns, for instance. Additional data inputs may be based on previous experience with similar devices, or other ways to capture prior knowledge to improve the accuracy of the diagnostics for the intended purpose. These additional data inputs may be quantitative or qualitative in nature.

Starting from the framework described above, we can describe the I, V signals in a battery cell (or other electrochemical cell) as follows, as a variation of EQ. 1:

$$V(t) = V_{oc} + \text{conv}(H,I) = \int_{-\infty}^{t} H(t-\tau)I(\tau)d\tau \quad \text{(EQ. 8)}$$

where H(t) is the impulse response of the electrochemical system.

Some variations of the present invention are premised on the use of a series of double pulses as the current inputs, i.e., $$I(t) = I_0 \sum_{n=0}^{\infty} [H(nT) - 2H(nT + \Delta t) + H(nT + 2\Delta t)] \quad \text{(EQ. 9)}$$

where I(t) is the electrical current, the impulse response H(t) here is modeled as the Heaviside step function (also known as the unit step function), $I_0$ is the amplitude of the current steps, $\Delta t$ is the step width in time t, and T is the period between pulse sequences. A schematic of the model and an illustration of an exemplary double-pulse current-input signal are shown in FIG. 1. In FIG. 1, $\Delta t_0$ denotes the initial step width $\Delta t$ which may be varied optionally with $I_0$ and/or T in order to dynamically (in real time, on-line) maximize the signal-to-noise ratio, in some embodiments.

The magnitude of the constant-current discharge pulse is the same as the magnitude of the constant-current charge pulse, so that integration of current over time is zero. Since the integration of current over time is zero, the capacity of the battery is intact during the test, which indicates that the open-circuit voltage is constant, i.e., $V_{oc}(t) = V_{oc}$.

Applying the differential operation over EQ. 8, we have $$dV(t) = \int_0^\infty H(\tau)dI(t-\tau)d\tau \quad \text{(EQ. 9)}$$

where the differential operator d is defined as $df(t) = f(t+\delta t) - f(t)$. The Fourier transform on both sides of EQ. 9 reveals that the Fourier transform of the impulse response is the impedance, i.e., $$F(dV(t)) = F(H(t)) \times F(dI(t)) \quad \text{(EQ. 10)}$$

Equivalently, $$F(H(t)) = \frac{F(dV(t))}{F(dI(t))} = \frac{i\omega V(f)}{i\omega I(f)} = \frac{V(f)}{I(f)} = Z(f) \quad \text{(EQ. 11)}$$

Therefore, the impulse response H(t) from a double-pulse current input includes the impedance information inside its frequency domain.

In the following part, a mechanism to derive H(t) is provided, based on the I, V signals sampled from a "noisy" vehicle environment. This derivation of H(t) is based on the adaptive filtering technique in that H(t) is updated in time based on the concept of the Kalman filter.

Two digital filtering techniques that may be applied here to update the H(t) include the finite impulse response (FIR) technique and the infinite impulse response (IIR) technique. Other digital filtering techniques may be applied as well.

The FIR technique assumes that the impulse response of the battery decays to zero in a finite period of time. Based on EQ. 9, the digital realization of the FIR is $$dV(t) = H(0)dI(t) + H(1)dI(t-T) + H(2)dI(t-2T) + \ldots + H(n)dI(t-nT) \quad \text{(EQ. 12)}$$

Figure 2:
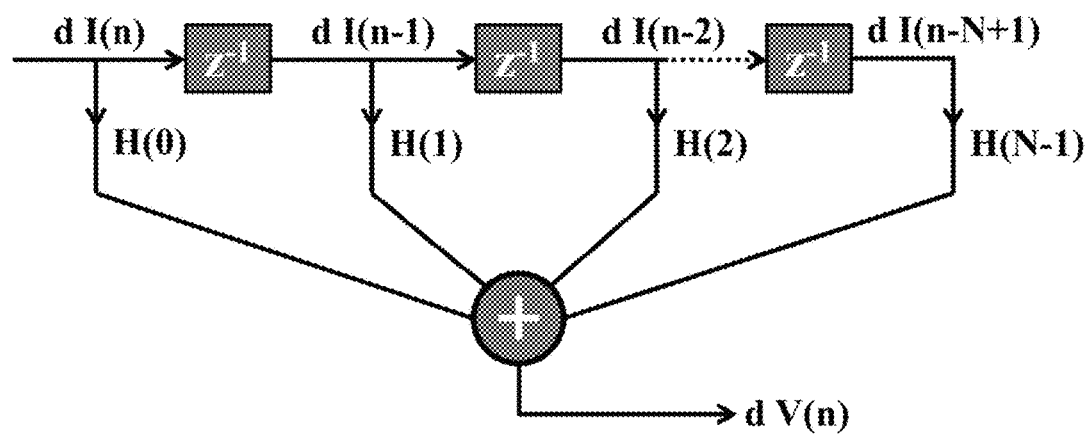
FIG. 2 is an illustration of a finite impulse response digital filtering technique, according to some embodiments.

An illustration of EQ. 12 is shown in FIG. 2.

The IIR technique does not require the assumption on H(t) that the impulse response of the battery decays to zero in a finite period of time. In an IIR implementation, we have the following realization:

$$dV(t) = \sum_{k=0}^{m} H(k)dI(t-kT) - \sum_{k=1}^{n} b_k dV(t-kT) \quad \text{(EQ. 13)}$$

Figure 3:
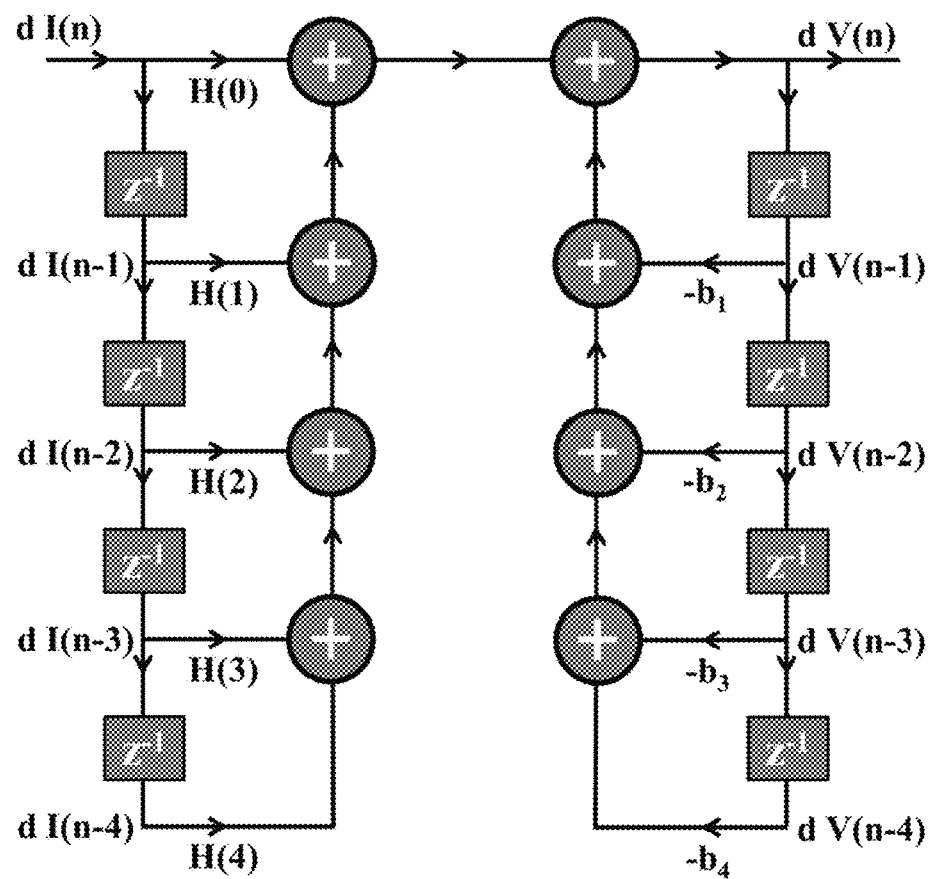
FIG. 3 is an illustration of an infinite impulse response digital filtering technique, according to some embodiments.

An illustration of the EQ. 13 is shown in FIG. 3.

The impulse response H(t) may be solved via either EQ. 12 or EQ. 13 (or both, if desired). Considering the measured I, V signals are noisy, a preferred technique for finding H(t) is the Kalman filtering algorithm. The Kalman filter is an method which recursively update the variables (or states) based on streams of noisy input data. It tends to be more precise than methods based on a single measurement alone. The variables (states) are found with minimum covariance.

The premises of the method are that the underling system is linear and that all error terms and measurements have a white noise (i.e., average of noise is zero—not correlated with time).

In applying the Kalman algorithm in finding H(t), we use the following equations to update H(t), in the case of the FIR technique (the equations for IIR are similar):

Innovation or measurement residual: $r_k = dV_k - dI_k H_{k-1}$

Innovation (or residual) covariance: $S_k = dI_k P_{k-1} dI_k^T + R_k$

Optimal Kalman gain: $K_k = P_{k-1} dI_k^T S_k^{-1}$

Updated (a posteriori) state estimate: $H_k = H_{k-1} + K_k r_k$

Updated (a posteriori) estimate covariance: $P_k = (I - K_k H_k) P_{k-1}$ where $dV_k$ is the measured signal as $dV_k = V(t=k) - V(t=k-1)$; $dI_k$ is the measured signal row-vector as $dI_k = [dI(t=k), dI(t=k-1), \ldots, dI(t=k-n)]$; $H_k$ is the impulse response column-vector as $H_k = [H_0, H_1, \ldots, H_n]$; $P_k$ is the covariance matrix of the impulse response vector; $R_k$ is the covariance of the noise; and I is the identity matrix.

The above-described methods may be implemented in a suitable physical apparatus. In some variations, the invention provides an apparatus for dynamic characterization of an electrochemical system, the apparatus comprising a computer that is electrically linkable to the electrochemical system; the computer programmed using non-transitory memory with executable code for executing the steps of:

(a) exciting said electrochemical system with a plurality of double-pulse sequences, wherein each of said double-pulse sequences comprises a discharge pulse having a pulse width and a pulse amplitude, a charge pulse having said pulse width and said pulse amplitude, and a zero-current period;

(b) sensing, in said computer, current data inputs each comprising measured current at a plurality of times associated with said double-pulse sequences;

(c) sensing, in said computer, voltage data inputs each comprising measured voltage at a plurality of times associated with said double-pulse sequences;

(d) calculating, in said computer, a plurality of current-derivative data inputs each comprising the time derivative of said measured current at said plurality of times;

(e) calculating, in said computer, a plurality of voltage-derivative data inputs each comprising the time derivative of said measured voltage at said plurality of times; and (f) calculating an impulse response from said current, voltage, current-derivative, and voltage-derivative data inputs, at said plurality of times using a recursive or matrix-based method performed in said computer, wherein said impulse response characterizes the dynamics of said electrochemical system.

In some embodiments, the computer is programmed to filter out static noises associated with the current and voltage data inputs. In some embodiments, the computer is programmed to adjust the pulse width, to characterize a main response time of the electrochemical system. In these or other embodiments, the computer is programmed to adjust the pulse amplitude, to characterize a diffusion response of the electrochemical system.

The computer may be programmed to solve a least-squares matrix-based equation to calculate the impulse response. Alternatively, or additionally, the computer may be programmed to solve a recursive least-squares equation to calculate the impulse response. The computer may be programmed to utilize a recursive or matrix-based Kalman filtering technique to execute step (e). The computer may be programmed with a finite impulse response digital filter and/or infinite impulse response digital filter, to derive the impulse response at the plurality of times.

The computer may further be programmed to calculate the Fourier transform of the impulse response to obtain at least one electrochemical system stat, such as an electrochemical system state selected from the group consisting of state-of-charge, state-of-power, state-of-health, high-frequency resistance, charge-transfer resistance, and double-layer capacitance.

The "computer" utilized in the apparatus is any programmable computing device, or plurality of devices which may be distributed in time or space, capable of being programmed or otherwise caused to execute code for executing the steps of any of the methods described herein. Any programming languages or platforms may be employed, such as using C++ or MATLAB®, for example. The method may be embedded within a controller.

A computer may be a programmable power-supply apparatus electrically linkable with an electrochemical device for measurements. In some embodiments, a computer may include a power-supply apparatus as well as a separate computing device or area that is in communication with the power-supply apparatus.

In some embodiments, the computer has a processor, an area of main memory for executing program code under the direction of the processor, a storage device for storing data and program code and a bus connecting the processor, main memory, and the storage device; the code being stored in the storage device and executing in the main non-transient memory under the direction of the processor, to perform the steps of the methods recited in this description. Optionally, the computer may be configured to exchange data with a network (such as the Internet), and may carry out calculations on remote computers, servers, or via cloud computing.

Figure 4:
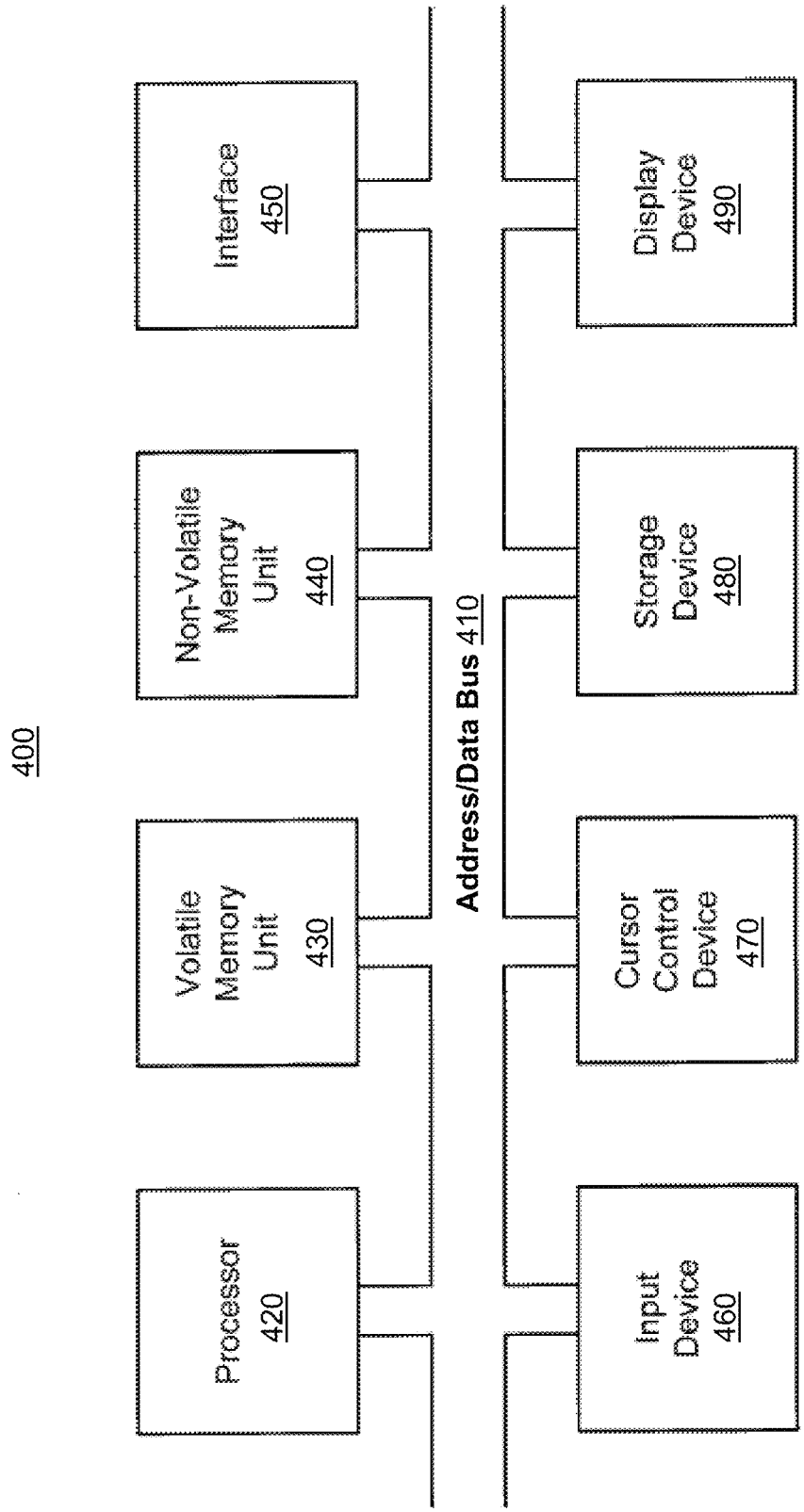
FIG. 4 is a depiction of an exemplary computer system, in accordance with some embodiments of the invention.

An exemplary computer system 400 in accordance with some embodiments is shown in FIG. 4. Exemplary computer system 400 is configured to perform calculations, processes, operations, and/or functions associated with a program or method. In some embodiments, certain processes and steps discussed herein are realized as a series of instructions (e.g., software program) that reside within computer-readable memory units and are executed by one or more processors of exemplary computer system 400. When executed, the instructions cause exemplary computer system 400 to perform specific actions and exhibit specific behavior, such as described herein.

Exemplary computer system 400 may include an address/data bus 410 that is configured to communicate information. Additionally, one or more data processing units, such as processor 420, are coupled with address/data bus 410. Processor 420 is configured to process information and instructions. In some embodiments, processor 420 is a microprocessor. Alternatively, processor 420 may be a different type of processor such as a parallel processor, or a field-programmable gate array.

Exemplary computer system 400 is configured to utilize one or more data-storage units. Exemplary computer system 400 may include a volatile memory unit 430, such as (but not limited to) random access memory ("RAM"), static RAM, or dynamic RAM, etc.) coupled with address/data bus 410, wherein volatile memory unit 430 is configured to store information and instructions for processor 420. Exemplary computer system 400 further may include a non-volatile memory unit 440, such as (but not limited to) read-only memory ("ROM"), programmable ROM ("PROM"), erasable programmable ROM ("EPROM"), electrically erasable programmable ROM ("EEPROM"), or flash memory coupled with address/data bus 410, wherein non-volatile memory unit 440 is configured to store static information and instructions for processor 420. Alternatively exemplary computer system 400 may execute instructions retrieved from an online data-storage unit such as in "cloud computing."

In some embodiments, exemplary computer system 400 also may include one or more interfaces, such as interface 450, coupled with address/data bus 410. The one or more interfaces are configured to enable exemplary computer system 400 to interface with other electronic devices and computer systems. The communication interfaces implemented by the one or more interfaces may include wireline (e.g., serial cables, modems, network adaptors, etc.) and/or wireless (e.g., wireless modems, wireless network adaptors, etc.) communication technology.

In some embodiments, exemplar computer system 400 may include an input device 460 coupled with address/data bus 410, wherein input device 460 is configured to communicate information and command selections to processor 420. In accordance with certain embodiments, input device 460 is an alphanumeric input device, such as a keyboard, that may include alphanumeric and/or function keys. Alternatively, input device 460 may be an input device other than an alphanumeric input device. In some embodiments, exemplar computer system 400 may include a cursor control device 470 coupled with address/data bus 410, wherein cursor control device 470 is configured to communicate user input information and/or command selections to processor 420. A cursor control device 470 may be implemented using a device such as a mouse, a track-ball, a track-pad, an optical tracking device, or a touch screen. A cursor control device 470 may alternatively, or additionally, be directed and/or activated via input from input device 460, such as in response to the use of special keys and key sequence commands associated with input device 460. Alternatively, or additionally, cursor control device 470 may be configured to be directed or guided by voice commands.

In some embodiments, exemplary computer system 400 further may include one or more optional computer-usable data-storage devices, such as storage device 480, coupled with address/data bus 410. Storage device 480 is configured to store information and/or computer-executable instructions. In some embodiments, storage device 480 is a storage device such as a magnetic or optical disk drive, including for example a hard disk drive ("HDD"), floppy diskette, compact disk read-only memory ("CD-ROM"), or digital versatile disk ("DVD"). In some embodiments, a display device 490 is coupled with address/data bus 410, wherein display device 490 is configured to display video and/or graphics. Display device 490 may include a cathode ray tube ("CRT"), liquid crystal display ("LCD"), field emission display ("FED"), plasma display or any other display device suitable for displaying video and/or graphic images and alphanumeric characters recognizable to a user.

Exemplary computer system 400 is presented herein as an exemplary computing environment in accordance with some embodiments. However, exemplary computer system 400 is not strictly limited to being a computer system. For example, exemplary computer system 400 may represent a type of data processing analysis that may be used in accordance with various embodiments described herein. Moreover, other computing systems may also be implemented. Indeed, the spirit and scope of the present technology is not limited to any single data processing environment. Thus, in some embodiments, one or more operations of various embodiments are controlled or implemented using computer-executable instructions, such as program modules, being executed by a computer. Such program modules may include routines, programs, objects, components and/or data structures that are configured to perform particular tasks or implement particular abstract data types. In addition, in some embodiments, one or more aspects are implemented by utilizing distributed computing environments, such as where tasks are performed by remote processing devices that are linked through a communications network, or such as where various program modules are located in both local and remote computer-storage media including memory-storage devices.

Other variations provide a system for dynamically characterizing an electrochemical device, the system comprising an electrochemical device and a programmable power-supply apparatus electrically linked with the electrochemical device, wherein the programmable power-supply apparatus is programmed using non-transitory memory with executable code for executing the steps of:

(a) exciting the electrochemical system with a plurality of double-pulse sequences, wherein each of the double-pulse sequences comprises a discharge pulse having a pulse width and a pulse amplitude, a charge pulse having the pulse width and the pulse amplitude, and a zero-current period;

(b) sensing, in the computer, current data inputs each comprising measured current at a plurality of times associated with the double-pulse sequences;

(c) sensing, in the computer, voltage data inputs each comprising measured voltage at a plurality of times associated with the double-pulse sequences;

(d) calculating, in the computer, a plurality of current-derivative data inputs each comprising the time derivative of the measured current at the plurality of times;

(e) calculating, in the computer, a plurality of voltage-derivative data inputs each comprising the time derivative of the measured voltage at the plurality of times; and (f) calculating an impulse response from the current, voltage, current-derivative, and voltage-derivative data inputs, at the plurality of times using a recursive or matrix-based method performed in the computer, wherein the impulse response characterizes the dynamics of the electrochemical system.

The electrochemical device may be selected from the group consisting of a battery, a fuel cell, an electrolytic cell, a capacitor, a supercapacitor, a pseudocapacitor, an electroplating system, and a galvanic corrosion system.

In some embodiments, the programmable power-supply apparatus is programmed to filter out static noises associated with the current and voltage data inputs.

In some embodiments, the programmable power-supply apparatus is programmed to adjust the pulse width, to characterize a main response time of the electrochemical system. The programmable power-supply apparatus may also be programmed to adjust the pulse amplitude, to characterize a diffusion response of the electrochemical system.

The programmable power-supply apparatus may be programmed to solve a least-squares recursive or matrix-based equation to calculate the impulse response. The programmable power-supply apparatus may be programmed to utilize a recursive or matrix-based Kalman filtering technique to execute step (e).

The programmable power-supply apparatus may be programmed with a finite impulse response digital filter to derive the impulse response at the plurality of times. Alternatively or additionally, the programmable power-supply apparatus may be programmed with an infinite impulse response digital filter to derive the impulse response at the plurality of times.

The programmable power-supply apparatus is further programmed, in some embodiments, to calculate the Fourier transform of the impulse response to obtain at least one electrochemical system state. The electrochemical system state may be selected from the group consisting of state-of-charge, state-of-power, state-of-health, high-frequency resistance, charge-transfer resistance, and double-layer capacitance.

Still other variations of this invention provide a computer-readable medium containing program instructions for characterizing the dynamics of an electrochemical system, wherein execution of the program instructions by one or more processors of a computer causes the one or more processors to carry out the steps of:

(a) exciting the electrochemical system with a plurality of double-pulse sequences, wherein each of the double-pulse sequences comprises a discharge pulse having a pulse width and a pulse amplitude, a charge pulse having the pulse width and the pulse amplitude, and a zero-current period;

(b) sensing, in the computer, current data inputs each comprising measured current at a plurality of times associated with the double-pulse sequences;

(c) sensing, in the computer, voltage data inputs each comprising measured voltage at a plurality of times associated with the double-pulse sequences;

(d) calculating, in the computer, a plurality of current-derivative data inputs each comprising the time derivative of the measured current at the plurality of times;

(e) calculating, in the computer, a plurality of voltage-derivative data inputs each comprising the time derivative of the measured voltage at the plurality of times; and (f) calculating an impulse response from the current, voltage, current-derivative, and voltage-derivative data inputs, at the plurality of times using a recursive or matrix-based method performed in the computer, wherein the impulse response characterizes the dynamics of the electrochemical system.

The computer-readable medium may be any known medium capable of containing instructions, or computer code, including (but not limited to) hard drives, disks, memory sticks, CDs, DVDs, flash memory devices, and so on. The computer-readable medium may be erasable, non-erasable, encrypted-erasable, etc.

In some embodiments, the program instructions include instructions to adjust the pulse width, to characterize a main response time of the electrochemical system. In some embodiments, the program instructions include instructions to adjust the pulse amplitude, to characterize a diffusion response of the electrochemical system.

In some embodiments, the program instructions include a Kalman filtering technique to execute step (f). In some embodiments, the program instructions include a finite impulse response digital filter or an infinite impulse response digital filter to derive the impulse response at the plurality of times. Also the program instructions may include instructions to estimate at least one electrochemical system state selected from the group consisting of state-of-charge, state-of-power, state-of-health, high-frequency resistance, charge-transfer resistance, and double-layer capacitance. The program instructions calculate the Fourier transform of the impulse response, in some embodiments, to obtain at least one of the electrochemical system states.

EXAMPLES

An experimental setup for demonstrations of the double-pulse technique for battery diagnostics, in Examples 1-4, is as follows. The battery used in the experiments is a single-cell lithium-ion battery which has a nominal capacity of 5.0 Ah and a voltage range of 2.7 to 4.1 V. A software program coded with MATLAB® is written to carry out calculations according to EQS. 8-13 and the FIR equations with the Kalman method in updating H(t) provided above.

The method is implemented and integrated with a Hardware-in-the-Loop (HWIL) battery testing system. The main facilities include a single-channel tester (BT2000, Arbin Instruments, College Station, Tex., US) that provides up to 5 kW at potentials between 0.6 and 5 V±1 mV and current ranges up to 1 kA±10 mA, and a thermal control chamber (Test Equity, Moorpark, Calif., US) for accommodating the lithium-ion battery with a programmable range from −40° C. to 130° C. (±10° C.).

A PC computer communicates with the tester to initiate the specific driving profiles, and to receive the I-V-T response measured from the battery. The communications between the above-mentioned modules are realized with TCP/IP protocols. The temporal jitter of the recorded data is about a few milliseconds. Based on the measured I-V data, the software program regresses out the impulse response H(t) in real time.

Example 1: Experimental Demonstration of Battery Diagnostics with a Double-Pulse Profile—Real-Time Acquisition of Impulse Response The lithium-ion battery is driven using a driving sequence repeated six times, as shown in FIG. 5A. This sequence includes a rest (98 seconds), a discharge pulse (1 second at −300 W), and a charge pulse (1 second at 300 W) at an input rate of 0.25 seconds. After the sixth sequence is applied, the battery is allowed to rest for a further 12 seconds to let it relax.

FIG. 5 demonstrates real-time acquisition of H(t) based on the measured I, V data, by driving the battery with a series of charge-discharge pulses at room temperature. The I(t) and V(t) data, shown in FIG. 5A, are then used to solve H(t) of the FIR implementation via a Kalman filter. The regressed H(t) function, shown in FIG. 5B, is then Fast-Fourier-transformed to obtain H(z). FIG. 5C shows the magnitude (top graph) and phase (bottom graph) plots for H(z). FIG. 5D shows the Nyquist plot for H(z), which demonstrates the impedance spectra of the battery kinetics.

Figure 5C:
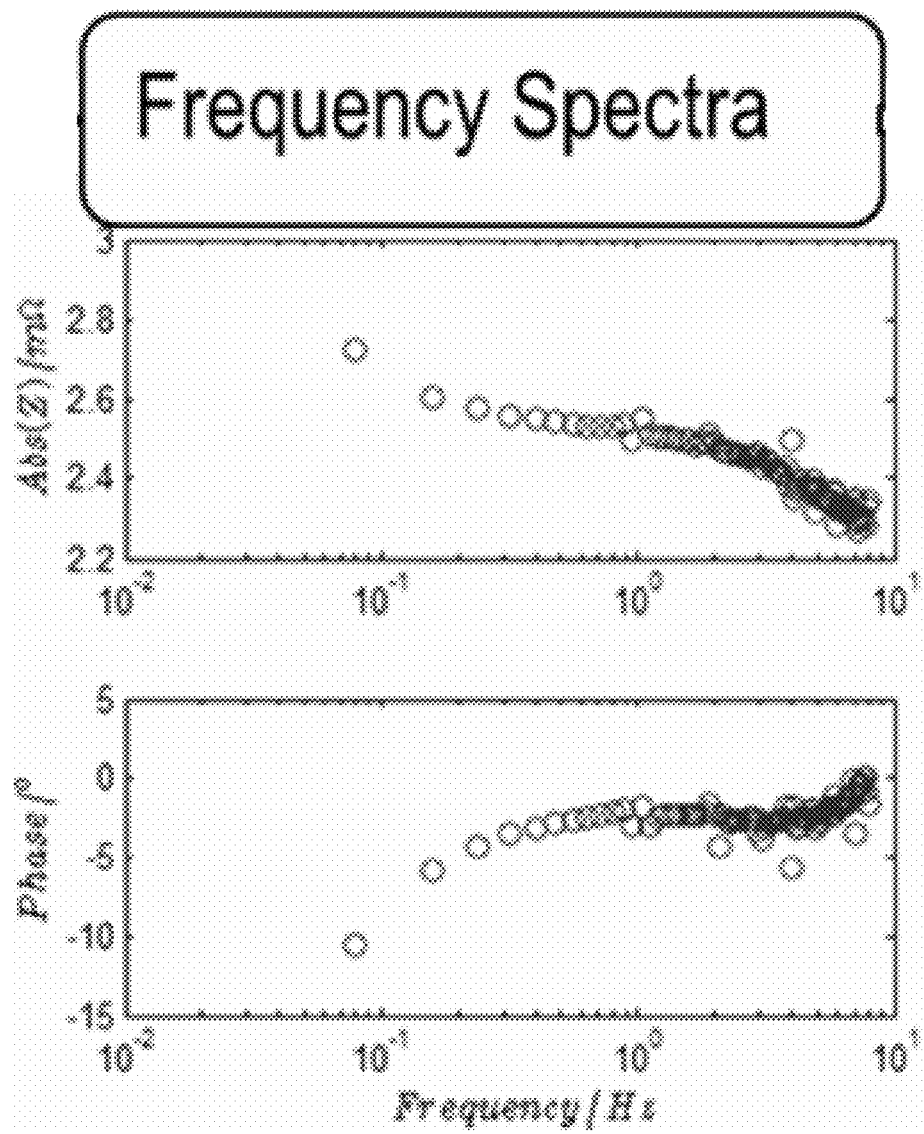
Figure 5D:
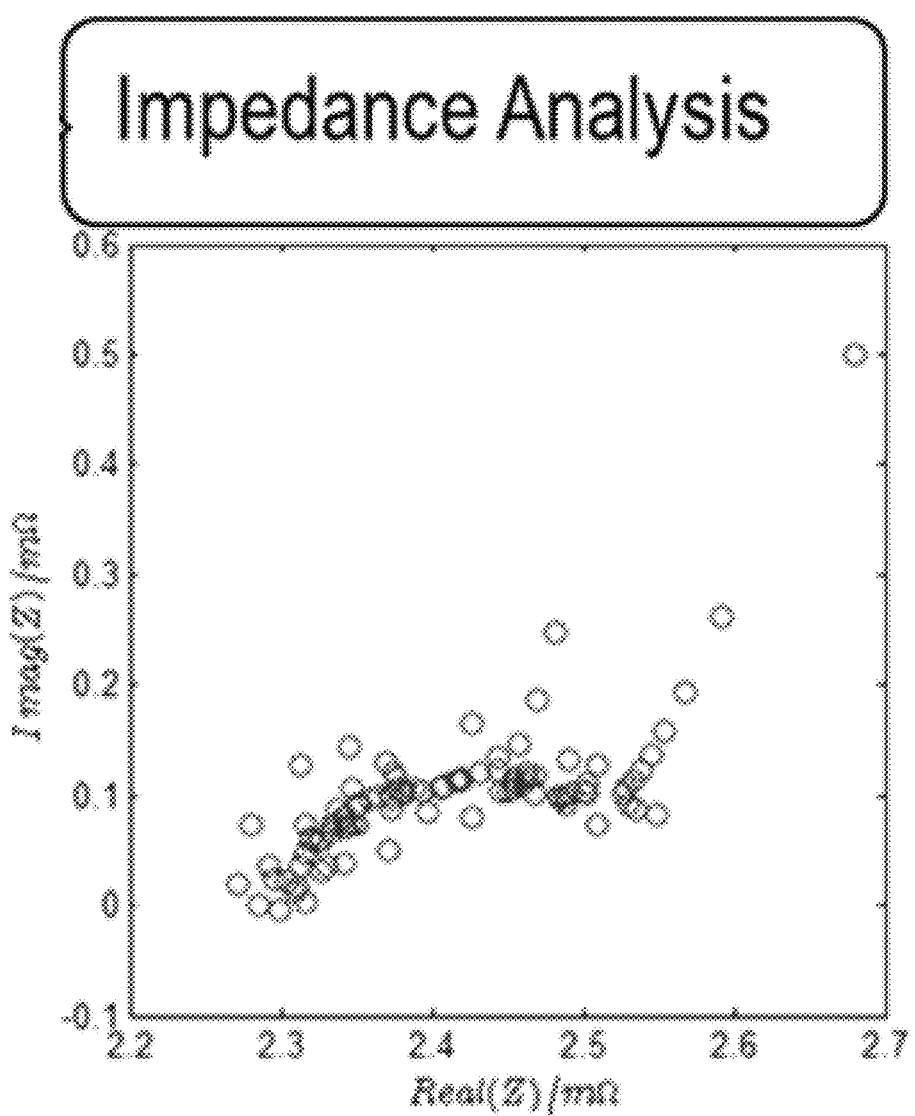
Figure 6A:
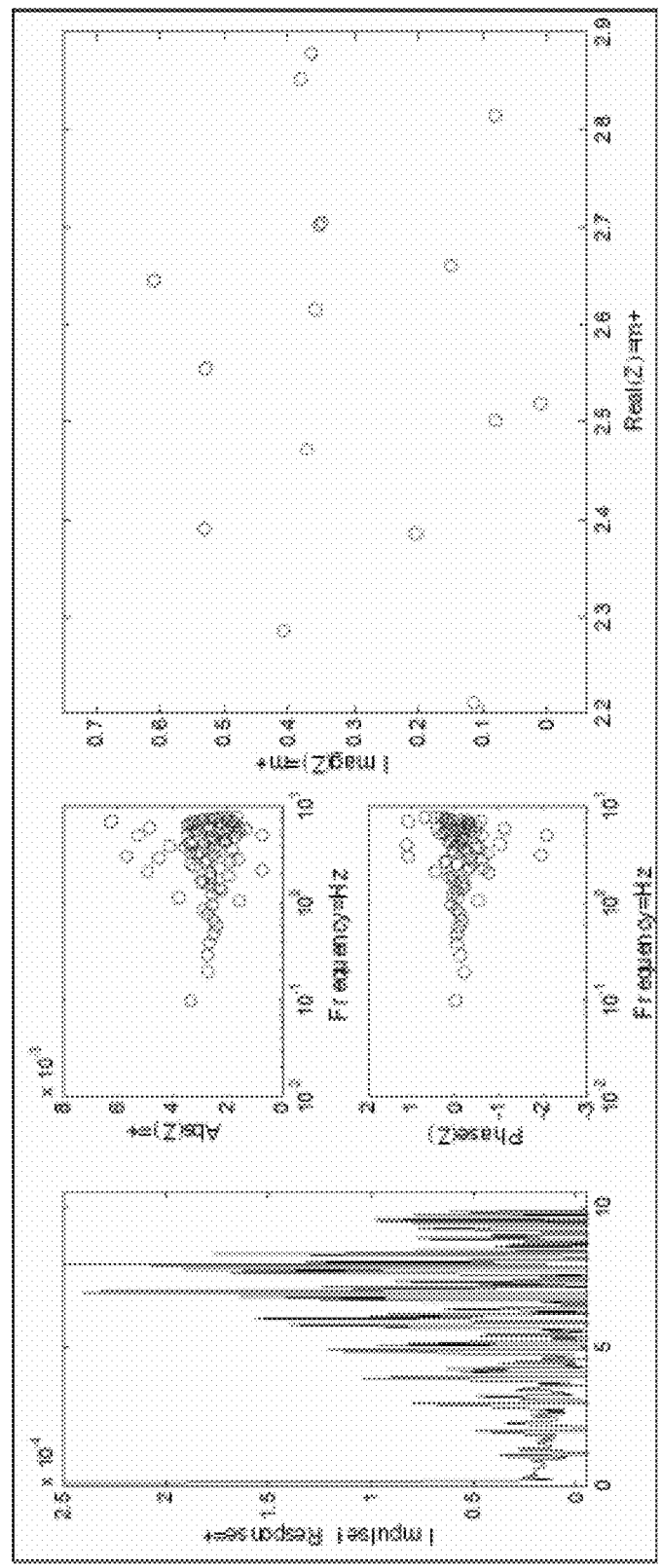
FIGS. 6A, 6B, 6C, and 6D show—for 1, 5, 10, and 15 repetitions of the pulse sequence, respectively—the impulse response H(t) (left-hand graph), the magnitude of H(z) (top-middle graph), the phase of H(z) (bottom-middle graph), and the Nyquist plot for the H(z) function (right graph).
Figure 6B:
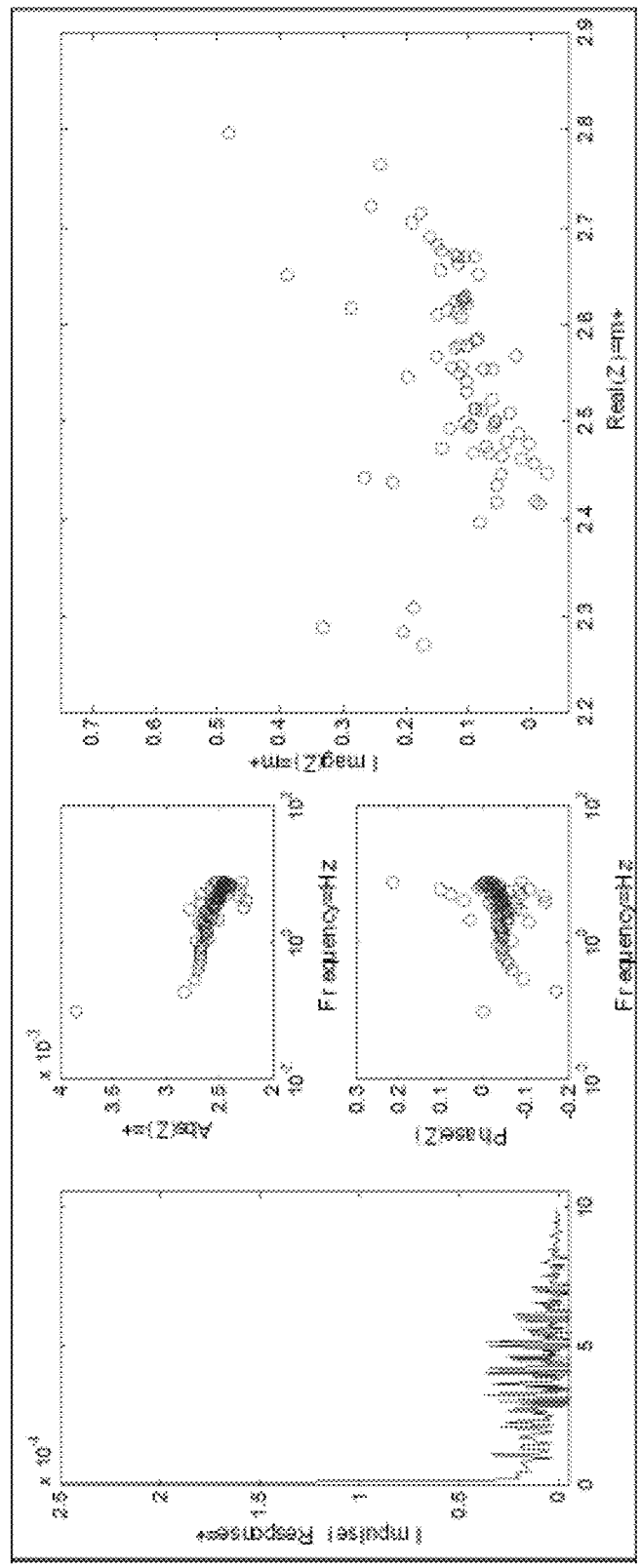
Figure 6C:
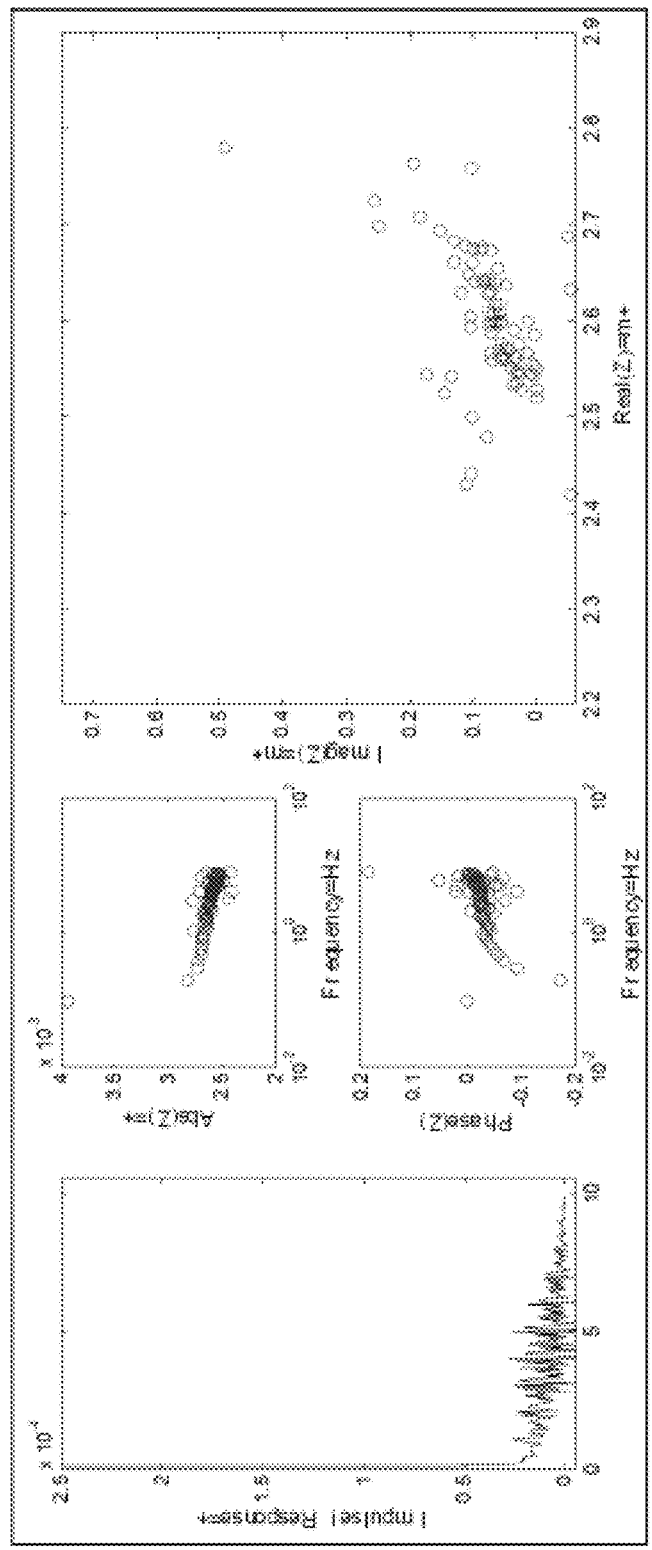
Figure 6D:
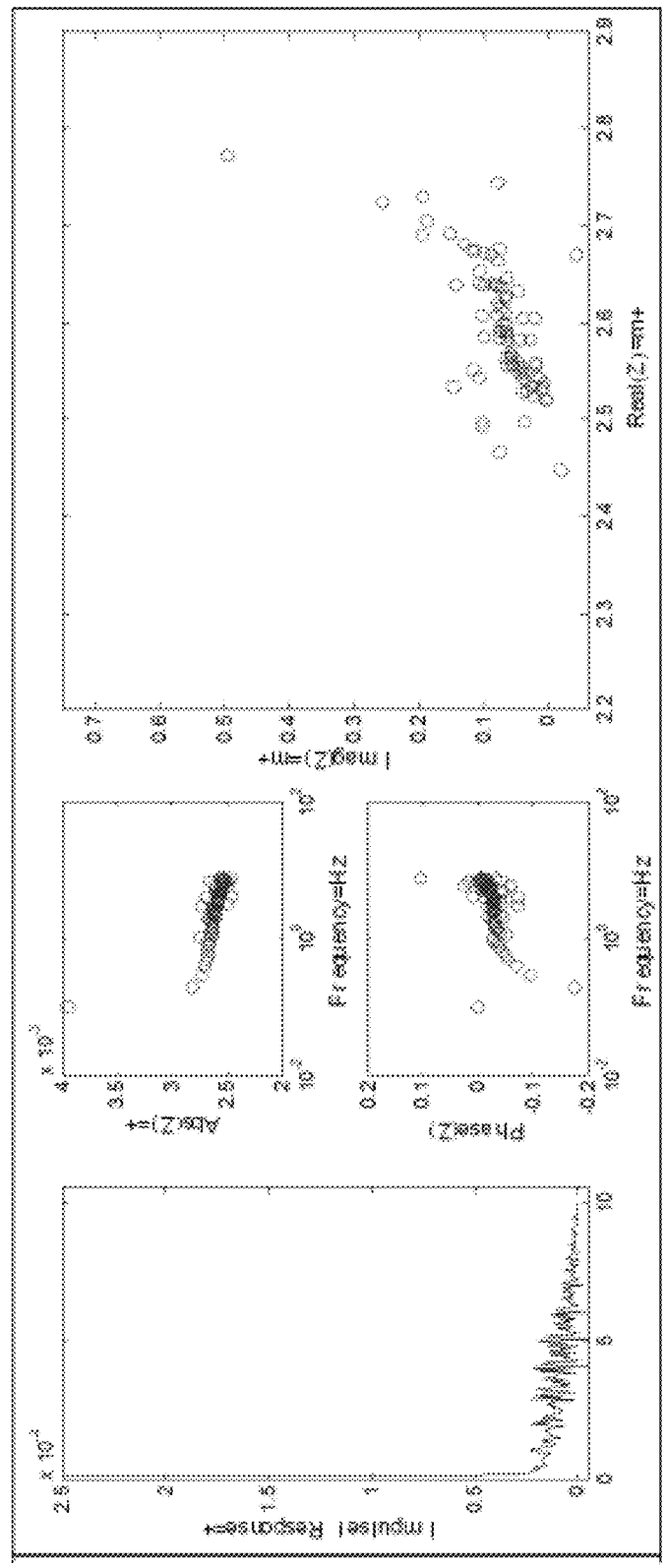

The Fourier transform of H(t) demonstrates the impedance spectra of the battery kinetics, in FIG. 5C. The Nyquist plot, FIG. 5D, of the impedance clearly shows the depressed semi-circle indicative of the constant phase element and diffusion (the low frequency tail).

Example 2: Experimental Demonstration of Battery Diagnostics with a Double-Pulse Profile—Signal Improvement with Number of Pulses These experiments are performed at room temperature with a starting state-of-charge (SOC) of 30%. The driving profile pulse sequence consists of a rest of 98 seconds, followed by a −50 A discharge pulse of 1 second, followed by a 50 A charge pulse of 1 second.

FIG. 6 demonstrates the improvement of the signal-to-noise ratio of H(t) as the number of pulses for H(t) regression is increased. In each plot, the H(t) function is plotted in addition to the magnitude, phase, and Nyquist plots for the H(z) function. In particular, FIG. 6A shows the impulse response H(t) (left-hand graph), the magnitude of H(z) (top-middle graph), the phase of H(z) (bottom-middle graph), and the Nyquist plot for the H(z) function (right graph) for 1 repetition of the pulse sequence. FIGS. 6B, 6C, and 6D show the same information for 5, 10, and 15 repetitions of the pulse sequence, respectively. As more pulses are applied in series, the H(t) function looks more clean, resulting in a better impedance spectra of the battery kinetics from the Nyquist plots of the H(z) function.

Example 3: Experimental Demonstration of Battery Diagnostics with a Double-Pulse Profile—Battery Kinetics at Different Temperatures These experiments are performed with a starting SOC of 60% and different environmental temperatures. The driving profile pulse sequence consists of a rest of 98 seconds, followed by a −50 A discharge pulse of 1 second, followed by a 50 A charge pulse of 1 second.

Figure 7A:
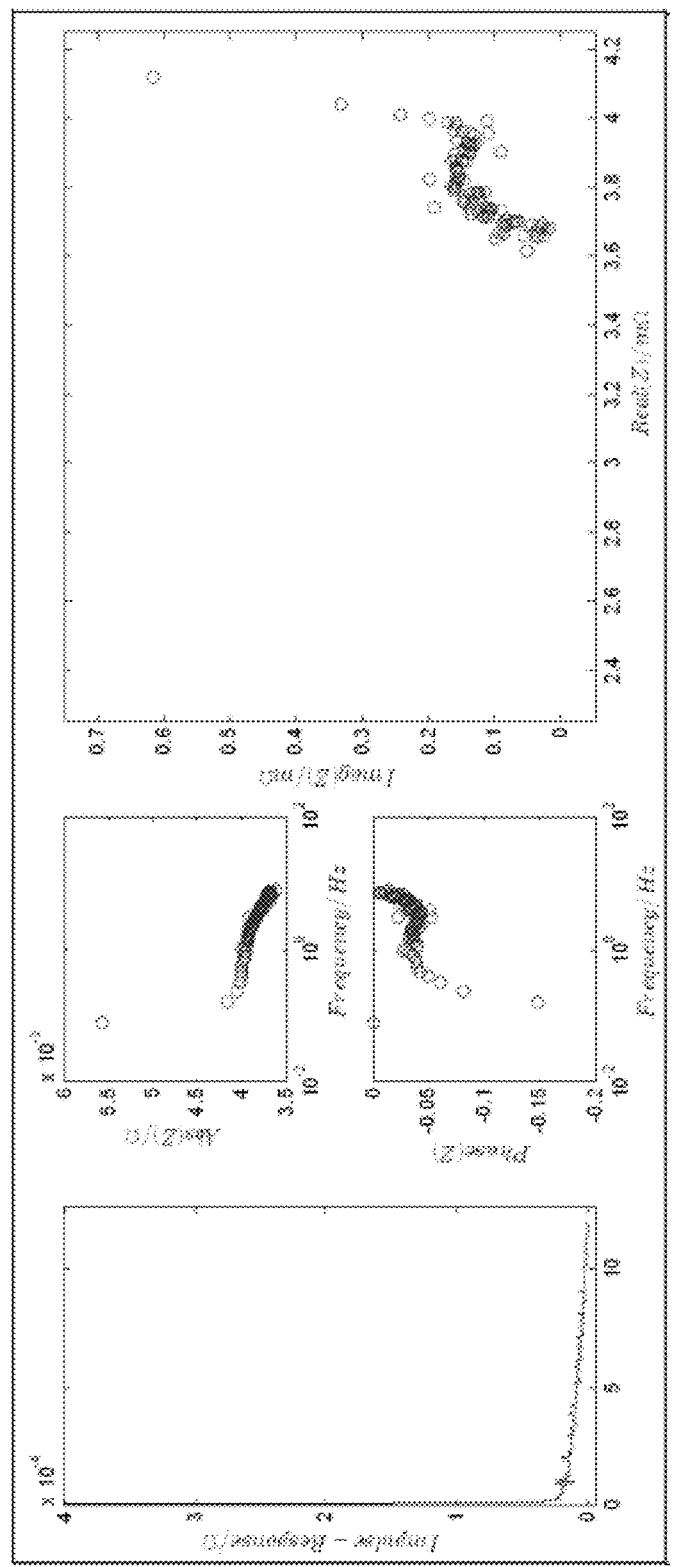
(FIG. 7A), 15° C.
Figure 7B:
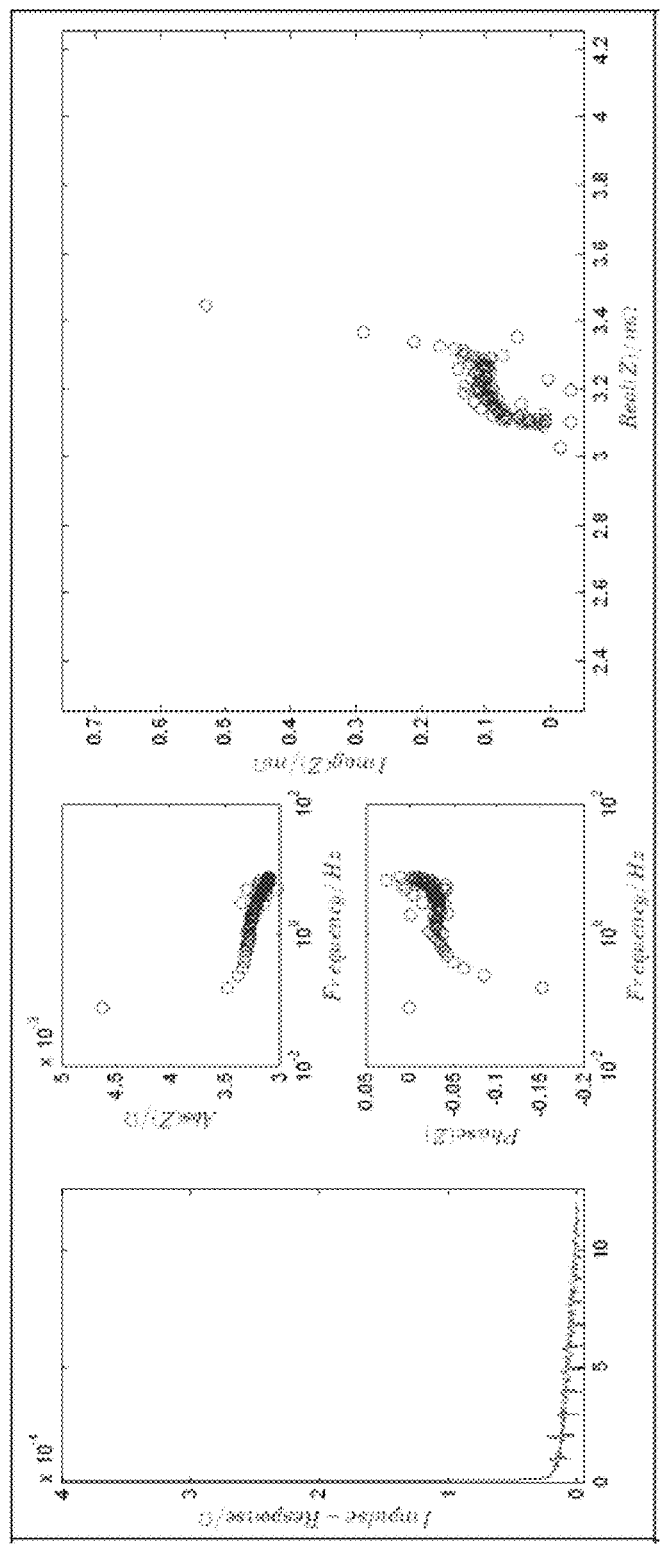
(FIG. 7B), 25° C.
Figure 7C:
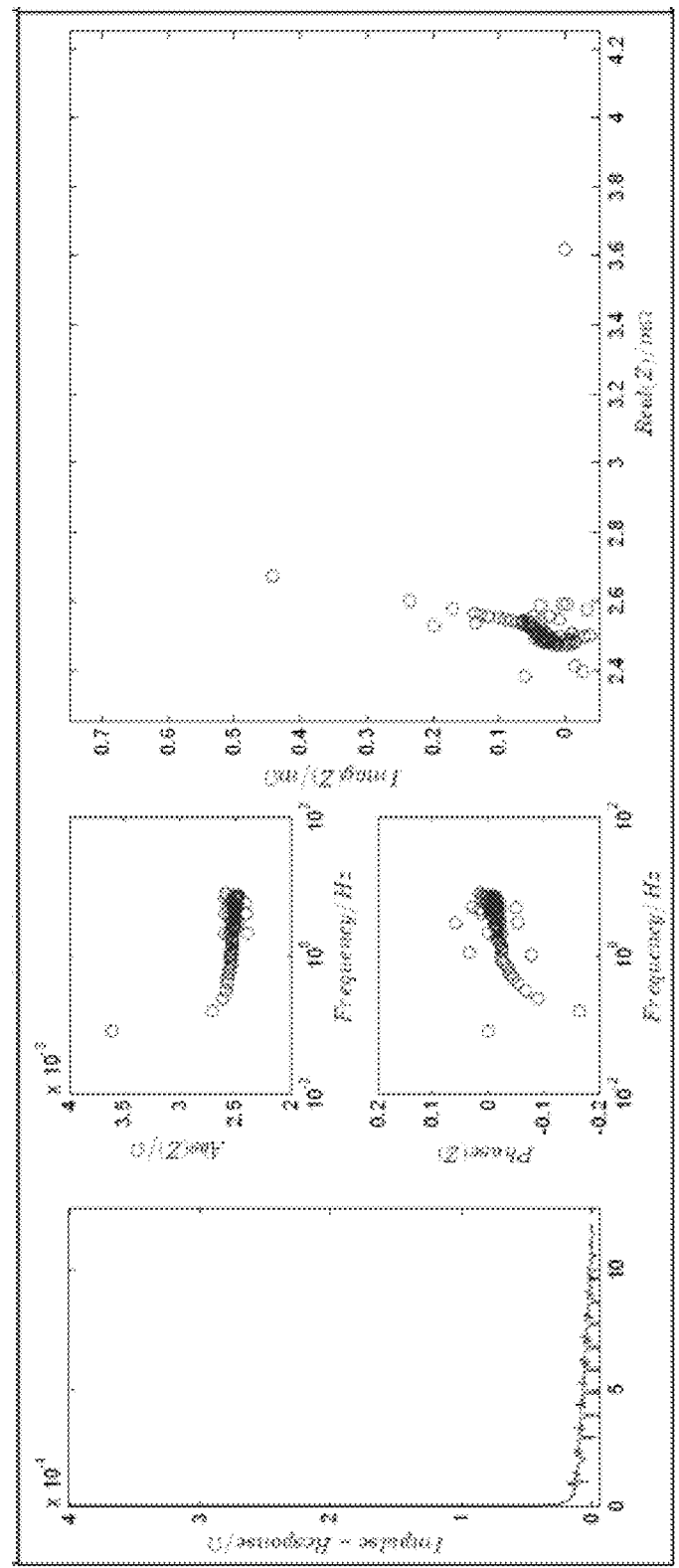
(FIG. 7C), and 30° C.
Figure 7D:
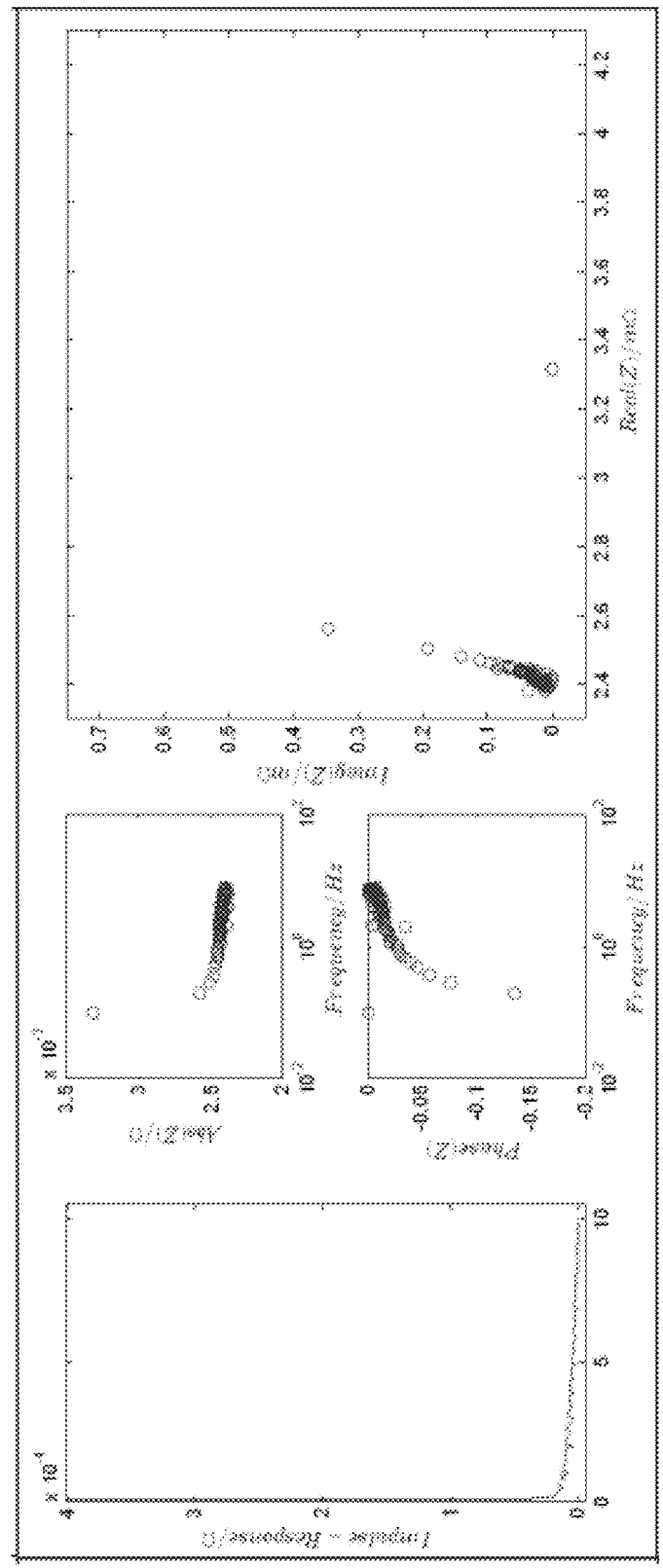
(FIG. 7D. Each figure shows the impulse response H(t) (left-hand graph), the magnitude of H(z) (top-middle graph), the phase of H(z) (bottom-middle graph), and the Nyquist plot for the H(z) function (right graph).

The temperatures tested are 10° C. (FIG. 7A), 15° C. (FIG. 7B), 25° C. (FIG. 7C), and 30° C. (FIG. 7D). In each plot, the H(t) function is plotted in addition to the magnitude, phase, and Nyquist plots for the H(z) function. In particular, FIG. 7A shows the impulse response H(t) (left-hand graph), the magnitude of H(z) (top-middle graph), the phase of H(z) (bottom-middle graph), and the Nyquist plot for the H(z) function (right graph) for a 10° C. environmental temperature. FIGS. 7B, 7C, and 7D show the same information for 15° C., 25° C., and 30° C., respectively.

FIG. 7 demonstrates a dramatic change of battery kinetics at different temperature, as exposed by the regressed H(t). These results show the widening of the constant phase element semicircle as the temperature decreases. Also, these results show how the starting point of the constant phase element semicircle shifts to the right with decreasing temperatures.

Example 4: Experimental Demonstration of Battery Diagnostics with a Double-Pulse Profile—Battery Kinetics at Different States of Charge These experiments are performed with a constant environmental temperature of 15° C. and different starting SOC values. The driving profile pulse sequence consists of a rest of 98 seconds, followed by a −50 A discharge pulse of 1 second, followed by a 50 A charge pulse of 1 second.

Figure 8A:
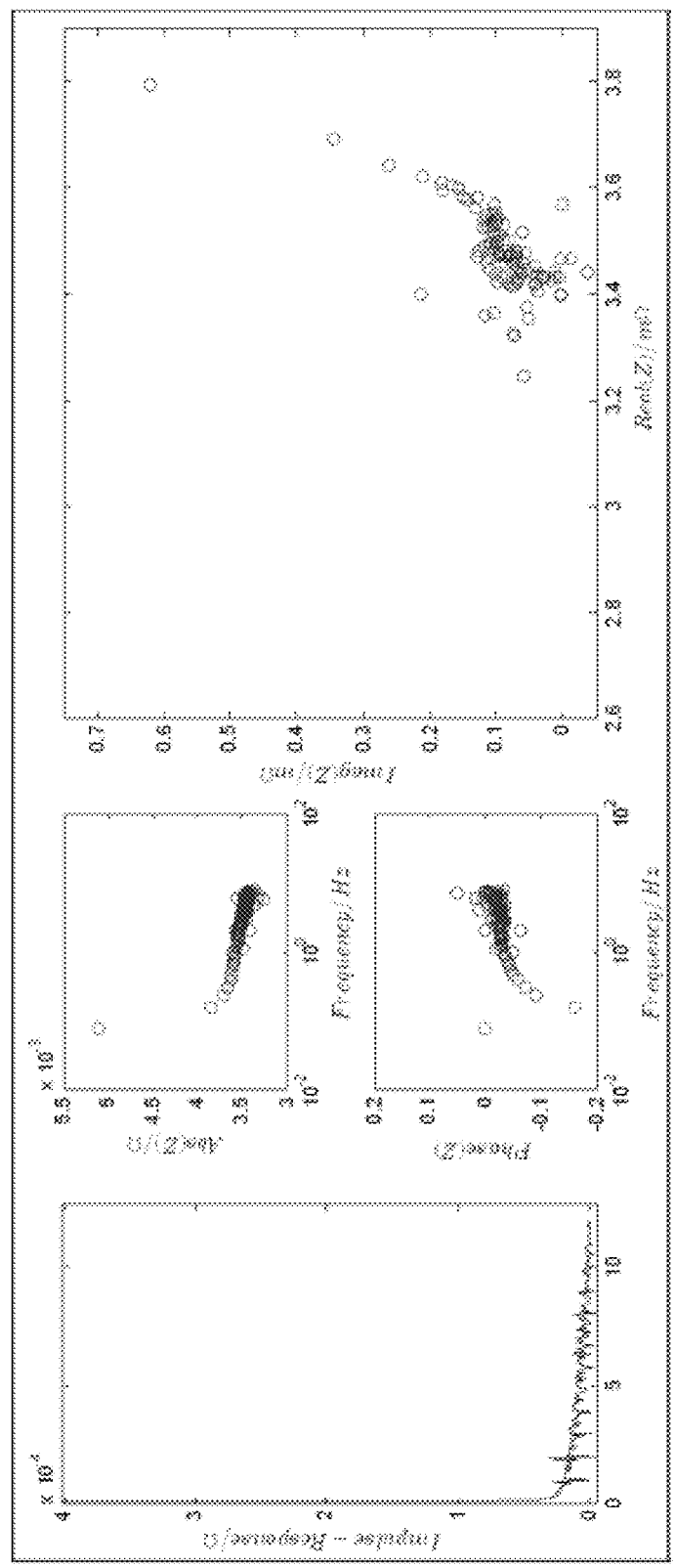
FIG. 8 is a series of experimental plots revealing battery kinetics at different states of charge. The starting SOC values tested are 30% (FIG. 8A), 40% (FIG. 8B), 60% (FIG. 8C), and 70% (FIG. 8D). Each figure shows the impulse response H(t) (left-hand graph), the magnitude of H(z) (top-middle graph), the phase of H(z) (bottom-middle graph), and the Nyquist plot for the H(z) function (right graph).
Figure 8B:
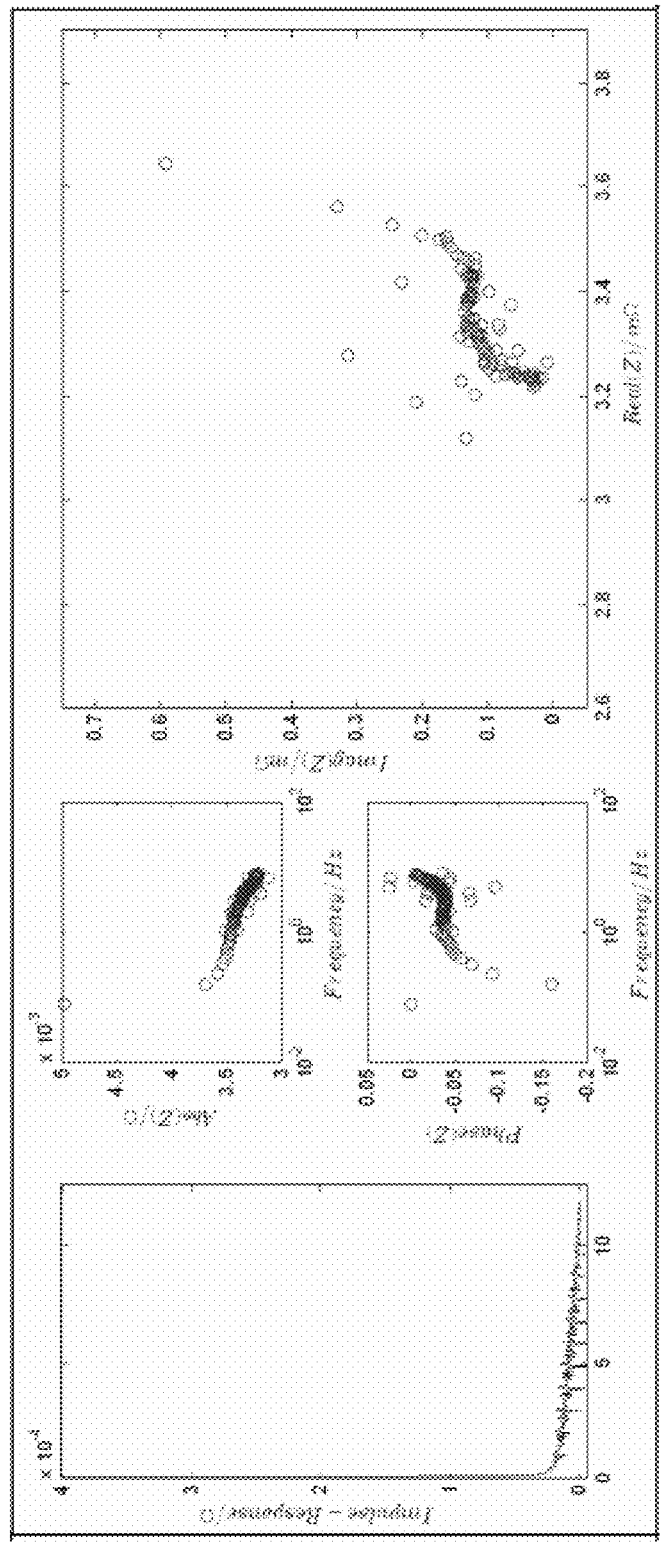
Figure 8C:
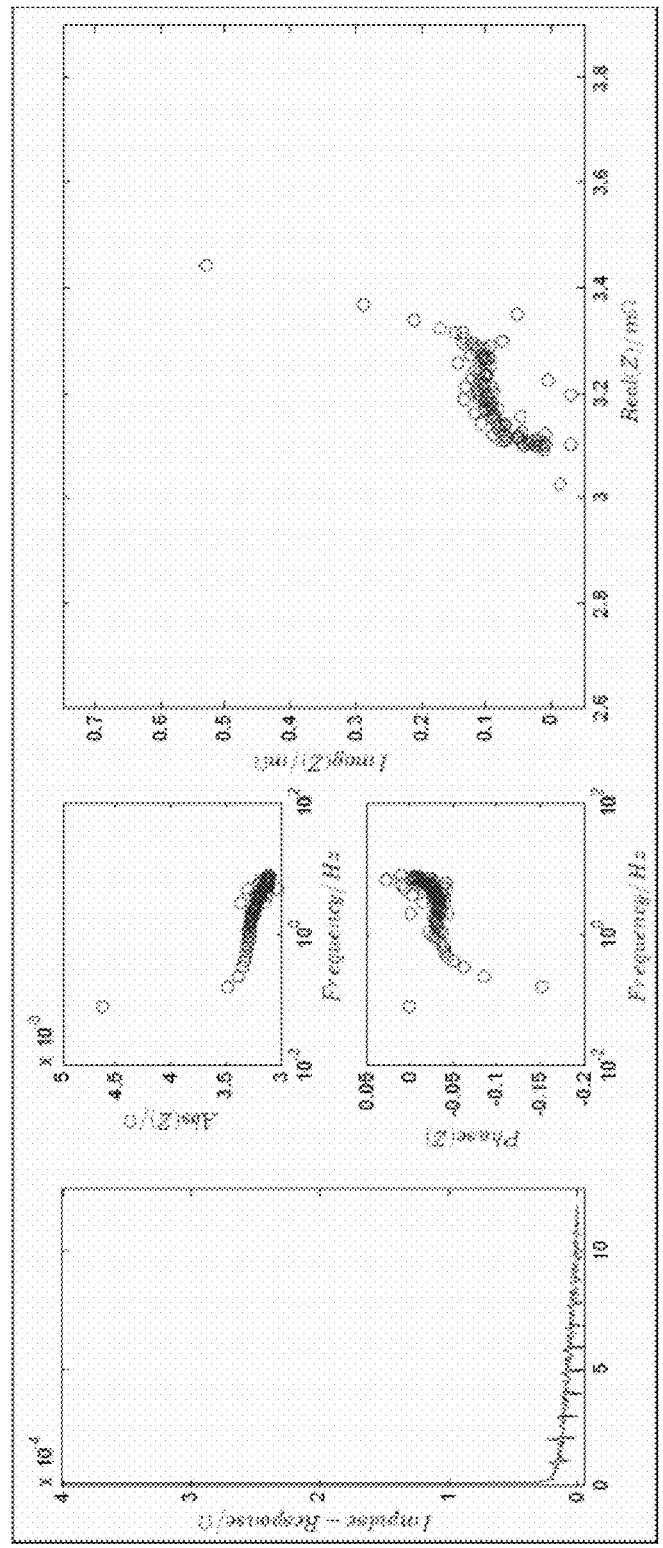
Figure 8D:
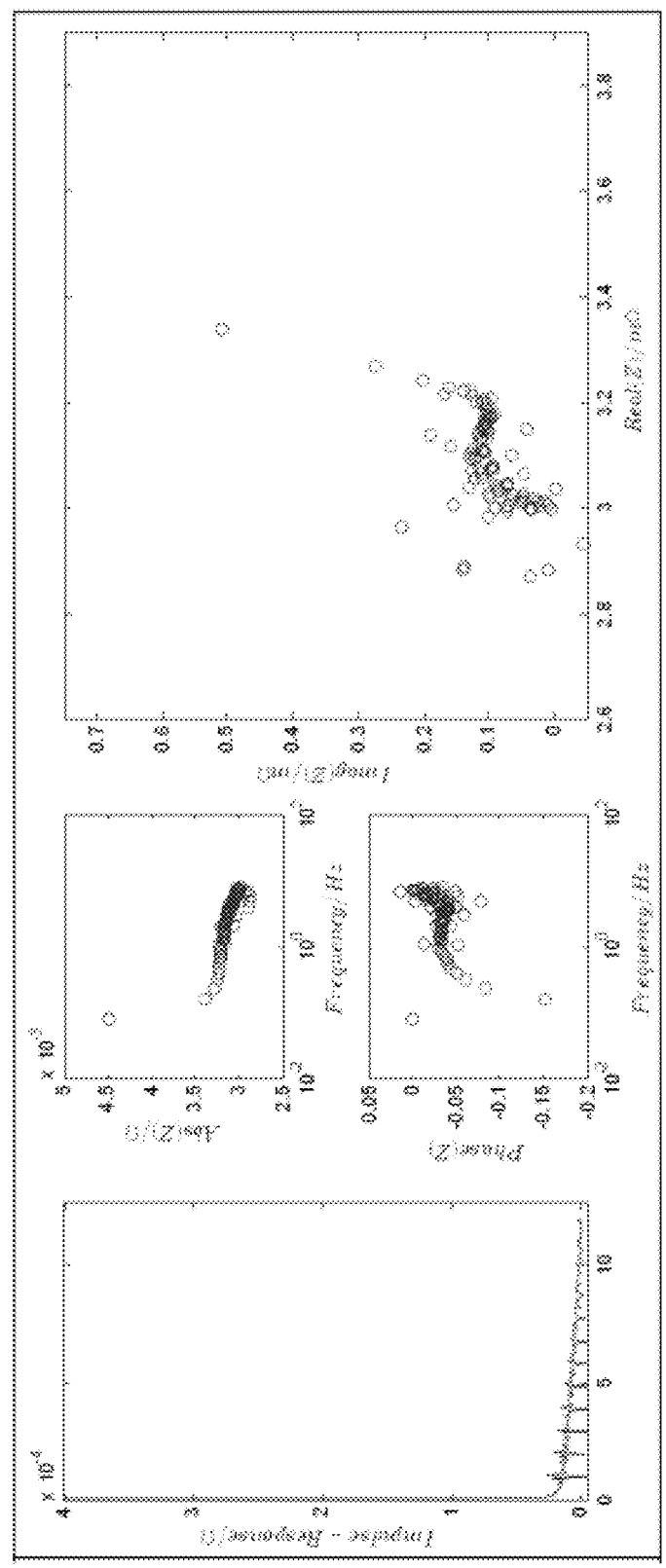

The starting SOC values tested are 30% (FIG. 8A), 40% (FIG. 8B), 60% (FIG. 8C), and 70% (FIG. 8D). In each plot, the H(t) function is plotted in addition to the magnitude, phase, and Nyquist plots for the H(z) function. In particular, FIG. 8A shows the impulse response H(t) (left-hand graph), the magnitude of H(z) (top-middle graph), the phase of H(z) (bottom-middle graph), and the Nyquist plot for the H(z) function (right graph) for a 30% starting SOC. FIGS. 8B, 8C, and 8D show the same information for 40%, 60%, and 70% SOC, respectively.

FIG. 8 reveals different battery kinetics at different state of capacities. These results show that the constant phase element semicircle stays similar in size, except for the 30% SOC case. As can be seen, the 30% SOC case also shows a noisier H(t), which could lead to a less accurate H(z) function. For these experiments, the constant phase element semicircle move to the right with decreasing starting SOC.

There are a wide variety of practical and commercial uses for the present invention. Applications of the methods in diagnosing electrochemical systems include, but are not limited to, battery diagnostics for in-flight batteries on satellites, aircraft, or other aviation vehicles; real-time management of fraction batteries for electric vehicles or hybrid-electric vehicles; battery-pack management for soldier power and ground vehicles; fuel cell diagnostics for personal devices, vehicles, stationary fuel cells; and in situ monitoring of corrosion in structural applications, to name a few.

In this detailed description, reference has been made to multiple embodiments and to the accompanying drawings in which are shown by way of illustration specific exemplary embodiments of the invention. These embodiments are described in sufficient detail to enable those skilled in the art to practice the invention, and it is to be understood that modifications to the various disclosed embodiments may be made by a skilled artisan.

Where methods and steps described above indicate certain events occurring in certain order, those of ordinary skill in the art will recognize that the ordering of certain steps may be modified and that such modifications are in accordance with the variations of the invention. Additionally, certain steps may be performed concurrently in a parallel process when possible, as well as performed sequentially.

All publications, patents, and patent applications cited in this specification are herein incorporated by reference in their entirety as if each publication, patent, or patent application were specifically and individually put forth herein.

The embodiments, variations, and figures described above should provide an indication of the utility and versatility of the present invention. Other embodiments that do not provide all of the features and advantages set forth herein may also be utilized, without departing from the spirit and scope of the present invention. Such modifications and variations are considered to be within the scope of the invention defined by the claims.

What is claimed is:

1. A method for dynamic characterization and management of an electrochemical system, said method comprising:
   (a) selecting an electrochemical system to be characterized at a plurality of times within a selected sampling window;
   (b) providing a computer in operable communication with said electrochemical system, a current sensor disposed in electrical communication with said computer, and a voltage sensor disposed in electrical communication with said computer;
   (c) exciting said electrochemical system with a plurality of double-pulse sequences, wherein each of said double-pulse sequences comprises a discharge pulse having a pulse width and a pulse amplitude, a charge pulse having said pulse width and said pulse amplitude, and a zero-current period;
   (d) sensing, in said current sensor, current data inputs each comprising measured current at a plurality of times associated with said double-pulse sequences;
   (e) sensing, in said voltage sensor, voltage data inputs each comprising measured voltage at a plurality of times associated with said double-pulse sequences;
   (f) calculating, in said computer, a plurality of current-derivative data inputs each comprising the time derivative of said measured current at said plurality of times;
   (g) calculating, in said computer, a plurality of voltage-derivative data inputs each comprising the time derivative of said measured voltage at said plurality of times;

(h) calculating, in said computer, an impulse response from said current, voltage, current-derivative, and voltage-derivative data inputs, at said plurality of times using a recursive or matrix-based technique, wherein said impulse response dynamically characterizes said electrochemical system;

(i) calculating, in said computer, the Fourier transform of said impulse response to obtain at least one electrochemical system state selected from the group consisting of state-of-health, state-of-charge, state-of-power, high-frequency resistance, charge-transfer resistance, and double-layer capacitance; and (j) managing said electrochemical system by adjusting electrical current and/or voltage to or from said electrochemical system in response to said at least one electrochemical system state selected in step (i).

2. The method of claim 1, wherein said discharge pulse is a constant-current discharge pulse and wherein said charge pulse is a constant-current charge pulse.

3. The method of claim 1, wherein each of said double-pulse sequences comprises a first zero-current period between said discharge pulse and said charge pulse, and a second zero-current period after said charge pulse.

4. The method of claim 1, wherein in step (c), said pulse width is tuned to characterize a main response time of said electrochemical system.

5. The method of claim 1, wherein in step (c), said pulse amplitude is tuned to characterize a diffusion response of said electrochemical system.

6. The method of claim 1, wherein step (h) utilizes a Kalman filtering technique.

7. The method of claim 1, wherein a finite impulse response digital filter is utilized to derive said impulse response at said plurality of times.

8. The method of claim 1, wherein an infinite impulse response digital filter is utilized to derive said impulse response at said plurality of times.

9. A system for dynamically characterizing and managing an electrochemical device, said system comprising an electrochemical device, a programmable power-supply apparatus electrically linked with said electrochemical device, a current sensor disposed in electrical communication with said programmable power-supply apparatus, and a voltage sensor disposed in electrical communication with said programmable power-supply apparatus, wherein said programmable power-supply apparatus is programmed using non-transitory memory with executable code for executing the steps of:

(a) exciting said electrochemical device, using said programmable power-supply apparatus, with a plurality of double-pulse sequences, wherein each of said double-pulse sequences comprises a discharge pulse having a pulse width and a pulse amplitude, a charge pulse having said pulse width and said pulse amplitude, and a zero-current period;

(b) sensing, in said current sensor, current data inputs each comprising measured current at a plurality of times associated with said double-pulse sequences;

(c) sensing, in said voltage sensor, voltage data inputs each comprising measured voltage at a plurality of times associated with said double-pulse sequences;

(d) calculating, in said programmable power-supply apparatus, a plurality of current-derivative data inputs each comprising the time derivative of said measured current at said plurality of times;

(e) calculating, in said programmable power-supply apparatus, a plurality of voltage-derivative data inputs each comprising the time derivative of said measured voltage at said plurality of times;

(f) calculating an impulse response from said current, voltage, current-derivative, and voltage-derivative data inputs, at said plurality of times using a recursive or matrix-based method performed in said programmable power-supply apparatus, wherein said impulse response characterizes the dynamics of said electrochemical system;

(g) calculating, in said programmable power-supply apparatus, the Fourier transform of said impulse response to obtain at least one electrochemical system state selected from the group consisting of state-of-health, state-of-charge, state-of-power, high-frequency resistance, charge-transfer resistance, and double-layer capacitance; and (h) managing said electrochemical system by adjusting electrical current and/or voltage to or from said electrochemical system in response to said at least one electrochemical system state selected in step (g).

10. The system of claim 9, wherein said electrochemical device is selected from the group consisting of a battery, a fuel cell, an electrolytic cell, a capacitor, a supercapacitor, a pseudocapacitor, an electroplating system, and a galvanic corrosion system.

11. The system of claim 9, wherein said programmable power-supply apparatus is programmed to adjust said pulse width, to characterize a main response time of said electrochemical system.

12. The system of claim 9, wherein said programmable power-supply apparatus is programmed to adjust said pulse amplitude, to characterize a diffusion response of said electrochemical system.

13. The system of claim 9, wherein said programmable power-supply apparatus is programmed to utilize a Kalman filtering technique to execute step (f).

14. A non-transitory computer-readable medium containing program instructions for characterizing the dynamics of an electrochemical system and managing said electrochemical system in operable communication with a computer, wherein execution of said program instructions by one or more processors of said computer causes said one or more processors to carry out the steps of:

(a) exciting said electrochemical system with a plurality of double-pulse sequences, wherein each of said double-pulse sequences comprises a discharge pulse having a pulse width and a pulse amplitude, a charge pulse having said pulse width and said pulse amplitude, and a zero-current period;

(b) receiving, in said computer, current data inputs each comprising measured current, from a current sensor, at a plurality of times associated with said double-pulse sequences;

(c) receiving, in said computer, voltage data inputs each comprising measured voltage, from a voltage sensor, at a plurality of times associated with said double-pulse sequences;

(d) calculating, in said computer, a plurality of current-derivative data inputs each comprising the time derivative of said measured current at said plurality of times;

(e) calculating, in said computer, a plurality of voltage-derivative data inputs each comprising the time derivative of said measured voltage at said plurality of times; and (f) calculating an impulse response from said current, voltage, current-derivative, and voltage-derivative data inputs, at said plurality of times using a recursive or matrix-based method performed in said computer, wherein said impulse response characterizes the dynamics of said electrochemical system;

(g) calculating, in said computer, the Fourier transform of said impulse response to obtain at least one electrochemical system state selected from the group consisting of state-of-health, state-of-charge, state-of-power, high-frequency resistance, charge-transfer resistance, and double-layer capacitance; and (h) managing said electrochemical system by adjusting electrical current and/or voltage to or from said electrochemical system in response to said at least one electrochemical system state selected in step (g).

15. The non-transitory computer-readable medium of claim 14, wherein said program instructions include instructions to adjust said pulse width, to characterize a main response time of said electrochemical system.

16. The non-transitory computer-readable medium of claim 14, wherein said program instructions include instructions to adjust said pulse amplitude, to characterize a diffusion response of said electrochemical system.

17. The non-transitory computer-readable medium of claim 14, wherein said program instructions include a Kalman filtering technique to execute step (f).

18. The non-transitory computer-readable medium of claim 14, wherein said program instructions include a finite impulse response digital filter or an infinite impulse response digital filter to derive said impulse response at said plurality of times.

* * * * *